United States Patent
Na et al.

(10) Patent No.: US 12,309,941 B2
(45) Date of Patent: May 20, 2025

(54) CIRCUIT BOARD

(71) Applicant: LG INNOTEK CO., LTD., Seoul (KR)

(72) Inventors: Se Woong Na, Seoul (KR); Jun Soo Park, Seoul (KR); Jung Eun Han, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 179 days.

(21) Appl. No.: 17/920,107

(22) PCT Filed: Apr. 20, 2021

(86) PCT No.: PCT/KR2021/004928
§ 371 (c)(1),
(2) Date: Oct. 20, 2022

(87) PCT Pub. No.: WO2021/215784
PCT Pub. Date: Oct. 28, 2021

(65) Prior Publication Data
US 2023/0180394 A1    Jun. 8, 2023

(30) Foreign Application Priority Data

Apr. 20, 2020 (KR) .......... 10-2020-0047340

(51) Int. Cl.
*H05K 3/34* (2006.01)
*H05K 1/11* (2006.01)
*H05K 3/46* (2006.01)

(52) U.S. Cl.
CPC .......... *H05K 3/3452* (2013.01); *H05K 1/111* (2013.01); *H05K 3/4644* (2013.01)

(58) Field of Classification Search
CPC ... H05K 2201/2072; H05K 2201/0191; H05K 2201/09036; H05K 2201/09045;
(Continued)

(56) References Cited

U.S. PATENT DOCUMENTS 9,040,838 B2   5/2015  Lee et al.
9,578,743 B2   2/2017  Nagai et al.
(Continued)

FOREIGN PATENT DOCUMENTS

JP    2011-192692    9/2011
KR    10-2006-0120399    11/2006
(Continued)

OTHER PUBLICATIONS

International Search Report dated Aug. 17, 2021 issued in Application No. PCT/KR2021/004928.
(Continued)

*Primary Examiner* — Timothy J Thompson
*Assistant Examiner* — Paramita Ghosh
(74) *Attorney, Agent, or Firm* — KED & ASSOCIATES, LLP

(57) ABSTRACT

A circuit board according to an embodiment comprises: an insulating layer including first to third regions; an outer layer circuit pattern disposed on the upper surface of the first to third regions of the insulating layer; and a solder resist including a first part disposed in the first region of the insulating layer, a second part disposed in the second region, and a third part disposed in the third region, wherein the outer layer circuit pattern has a first height, the third part of the solder resist is disposed on the upper surface of the outer layer circuit pattern to have a second height, the first region includes a first sub-region and a second sub-region, the first part includes a first sub-part disposed in the first sub-region and a second sub-part disposed in the second sub-region, the upper surface of the first sub-part is located to be higher than the upper surface of the outer layer circuit pattern and lower than the upper surface of the third part, the upper surface of the second sub-part is located to be lower than the upper surface of the outer layer circuit pattern, and the surface
(Continued)

roughness of the third part of the solder resist is different from the surface roughness of the first part of the solder resist.

20 Claims, 14 Drawing Sheets

(58) Field of Classification Search
CPC ...... H05K 3/3452; H05K 3/4644; H05K 3/28; H05K 3/287; H05K 1/111; H05K 1/0271; H05K 3/4007; H05K 2201/09736
See application file for complete search history.

(56) References Cited

U.S. PATENT DOCUMENTS

| | | | |
|---|---|---|---|
| 2002/0060090 A1* | 5/2002 | Ozeki | ................ H05K 1/0221 174/255 |
| 2014/0037862 A1 | 2/2014 | Lee et al. | |
| 2014/0196939 A1* | 7/2014 | Nishida | .................... H05K 3/28 174/261 |
| 2015/0364539 A1 | 12/2015 | Im et al. | |
| 2018/0063952 A1* | 3/2018 | Noguchi | .............. H05K 1/0271 |
| 2018/0352658 A1* | 12/2018 | Yang | ....................... H01L 24/25 |

FOREIGN PATENT DOCUMENTS

| | | |
|---|---|---|
| KR | 10-2014-0018016 | 2/2014 |
| KR | 10-2014-0027731 | 3/2014 |
| KR | 10-2015-0142936 | 12/2015 |
| KR | 10-2016-0020407 | 2/2016 |
| KR | 10-2016-0037783 | 4/2016 |

OTHER PUBLICATIONS

Korean Office Action dated Jan. 6, 2025 issued in Application No. 10-2020-0047340.

* cited by examiner

【FIG. 1A】
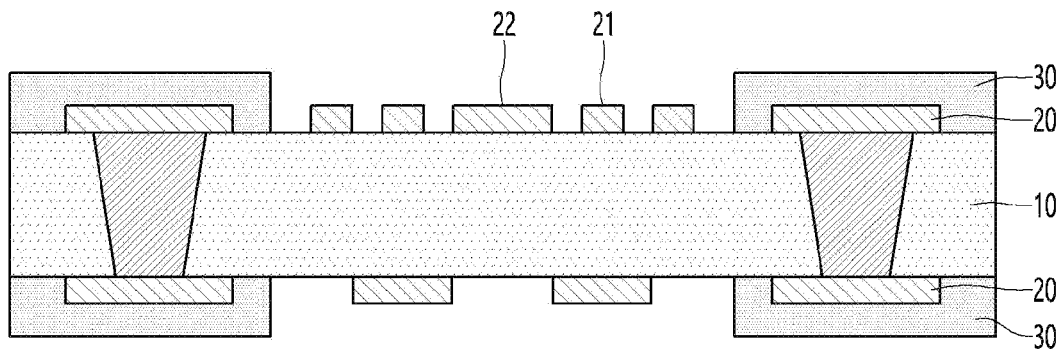
【FIG. 1B】
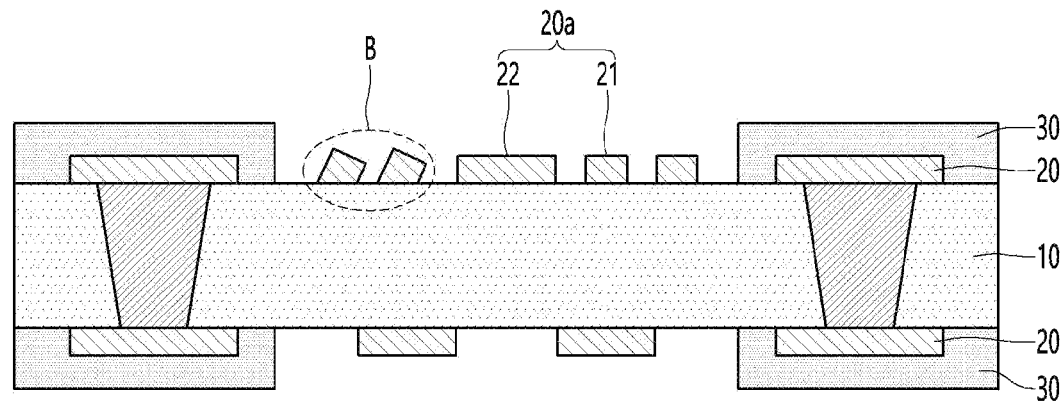

[FIG. 2]
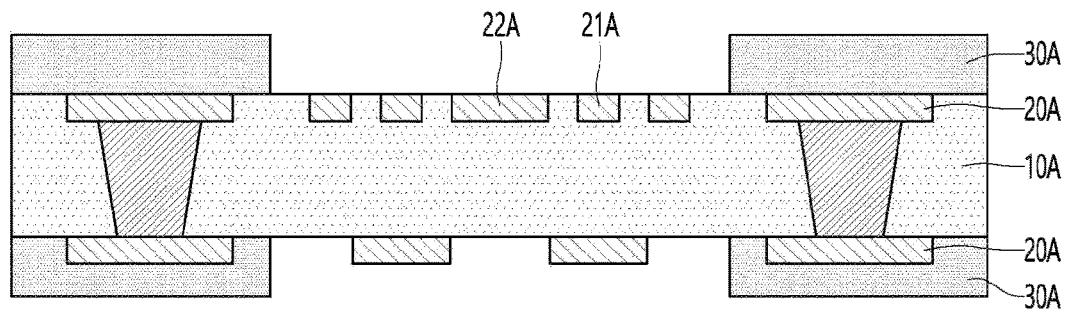

[FIG. 3]
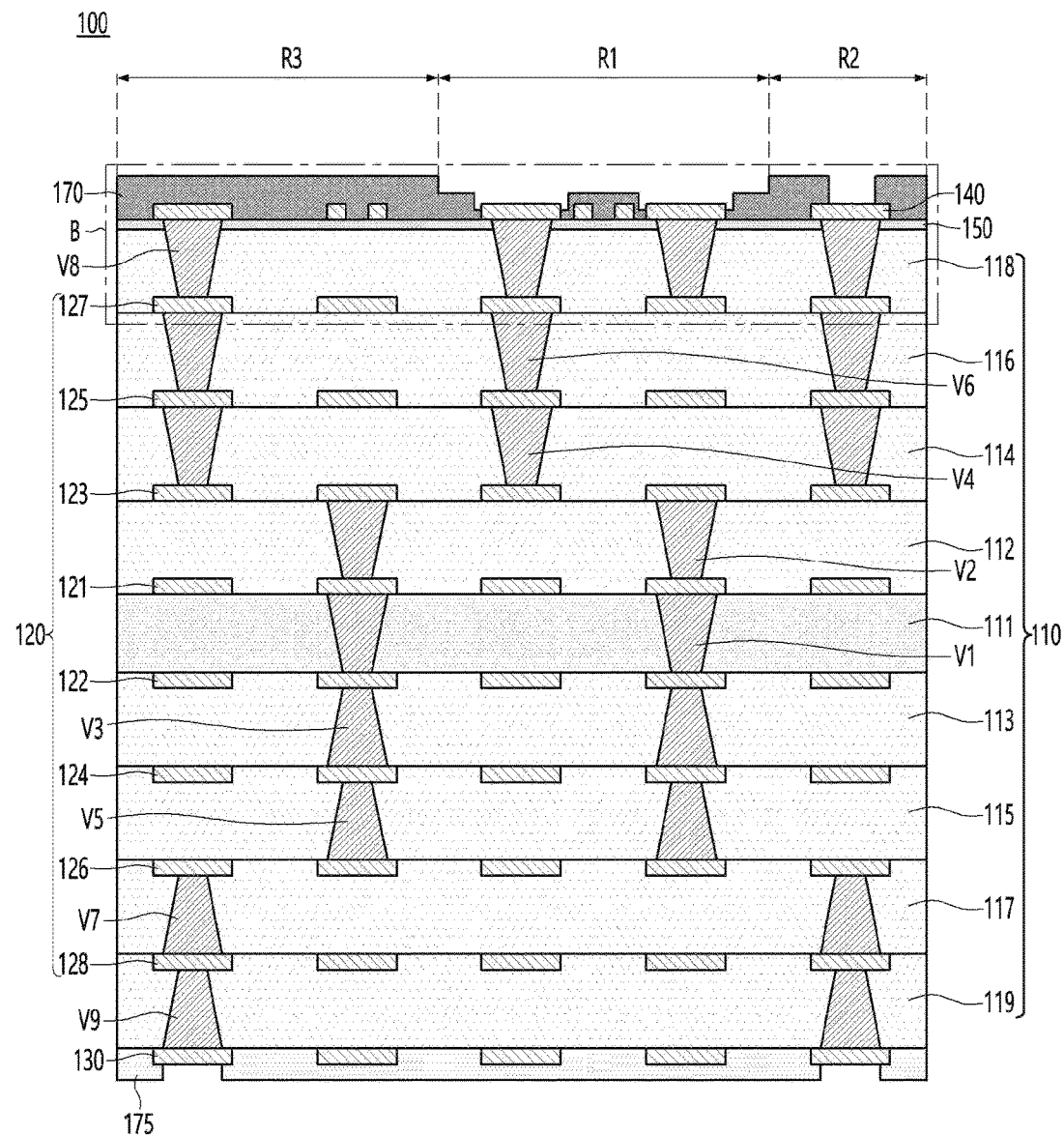

[FIG. 4]
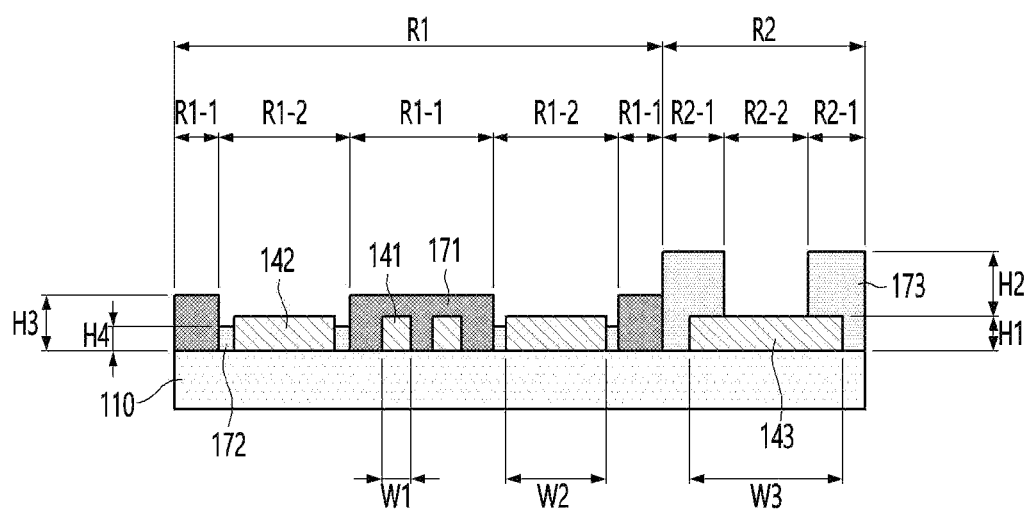

【FIG. 5A】
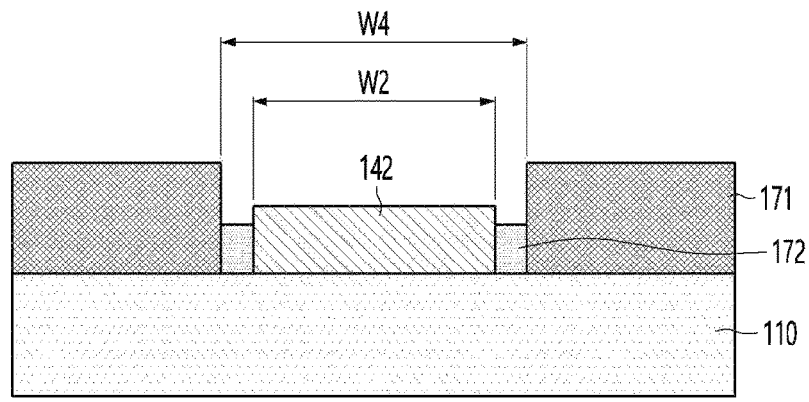
【FIG. 5B】
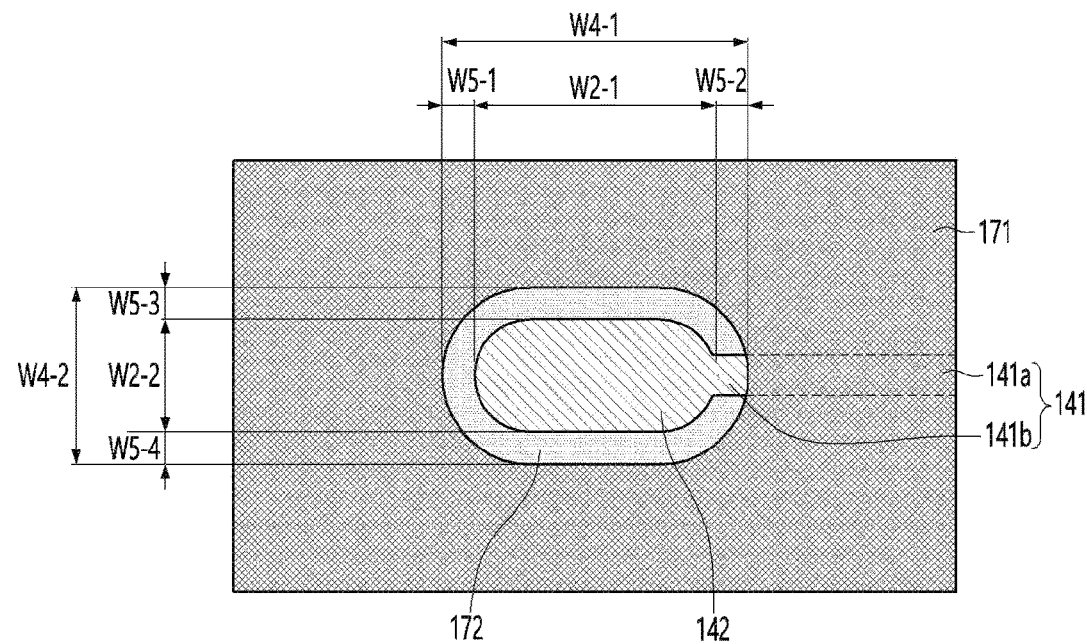

【FIG. 6A】
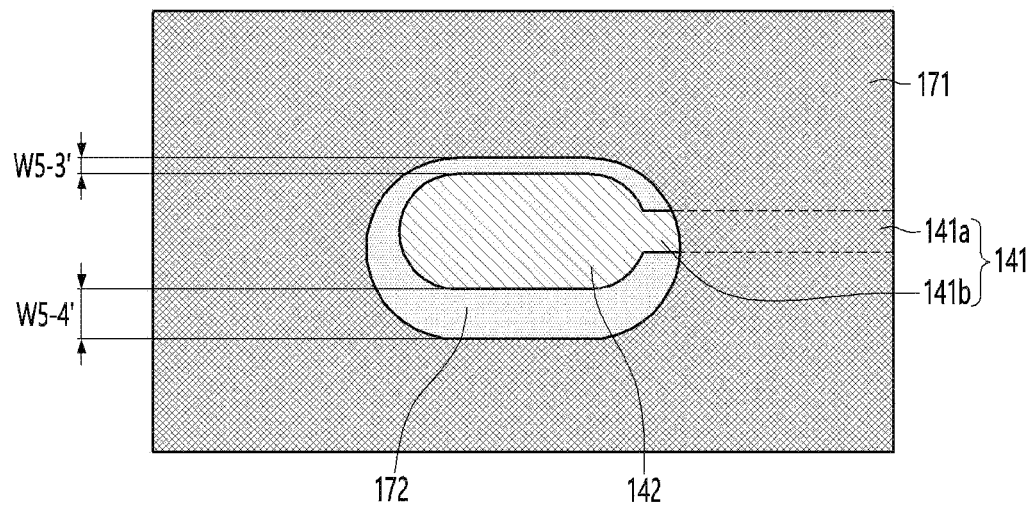
【FIG. 6B】
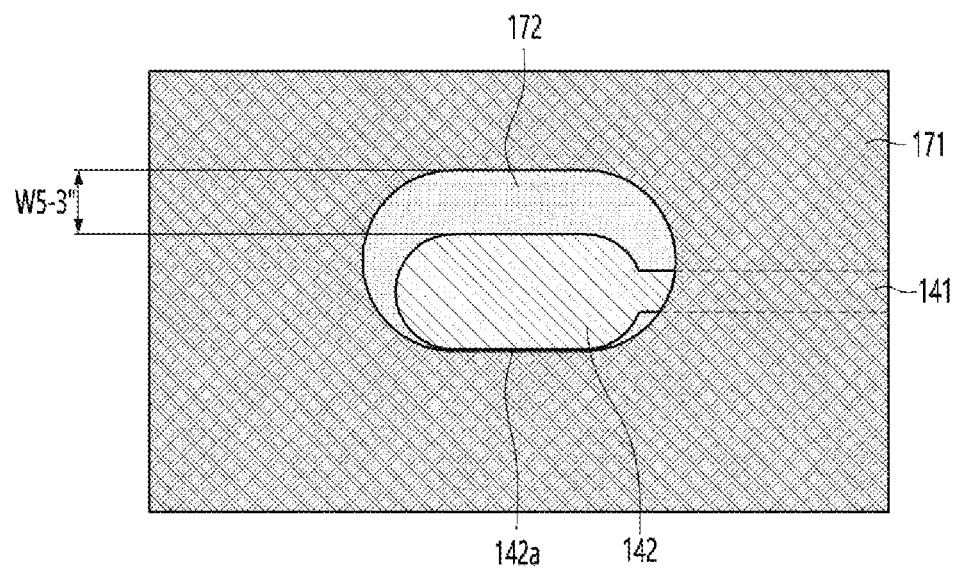

【FIG. 7A】
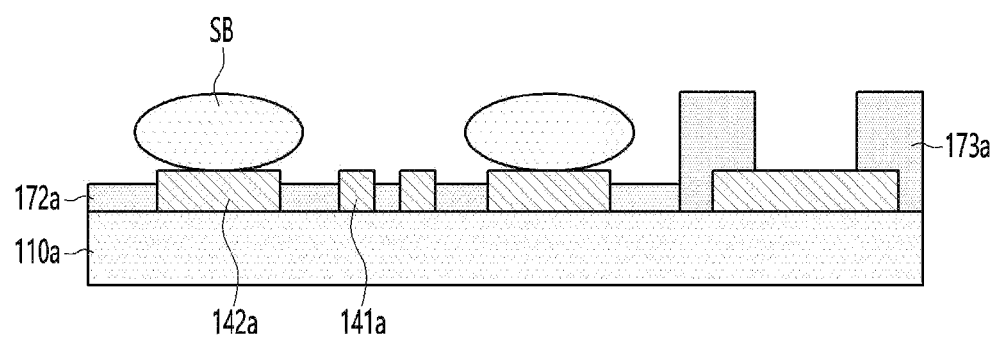
【FIG. 7B】
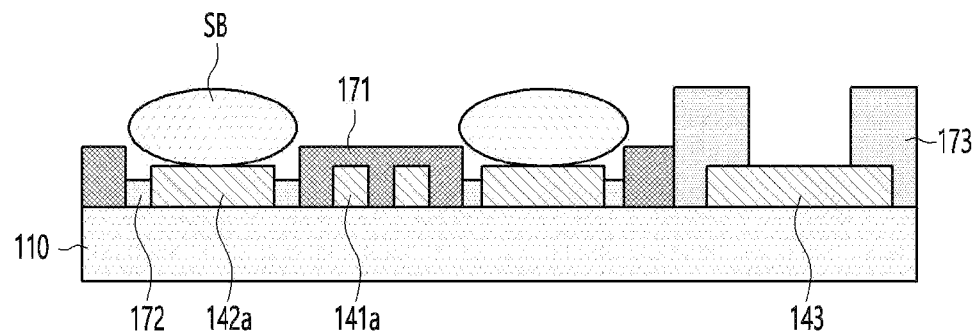

[FIG. 8A]
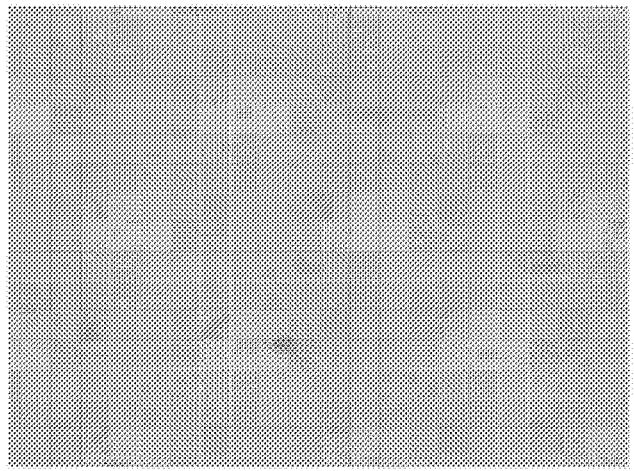
[FIG. 8B]
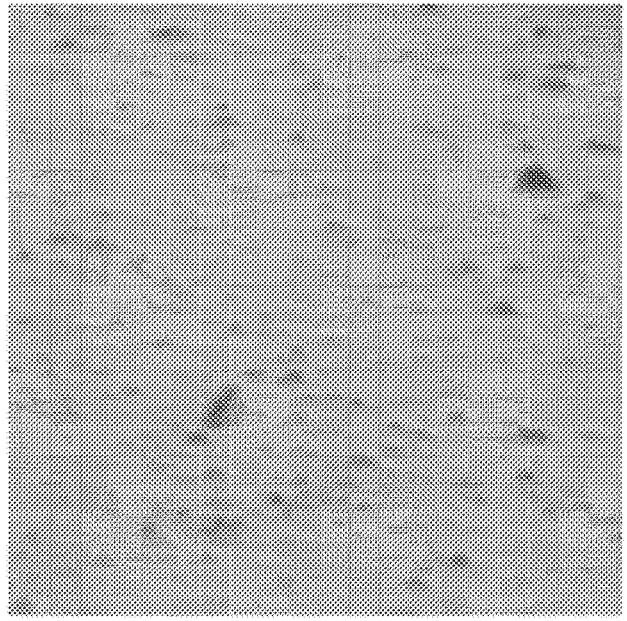

[FIG. 9]
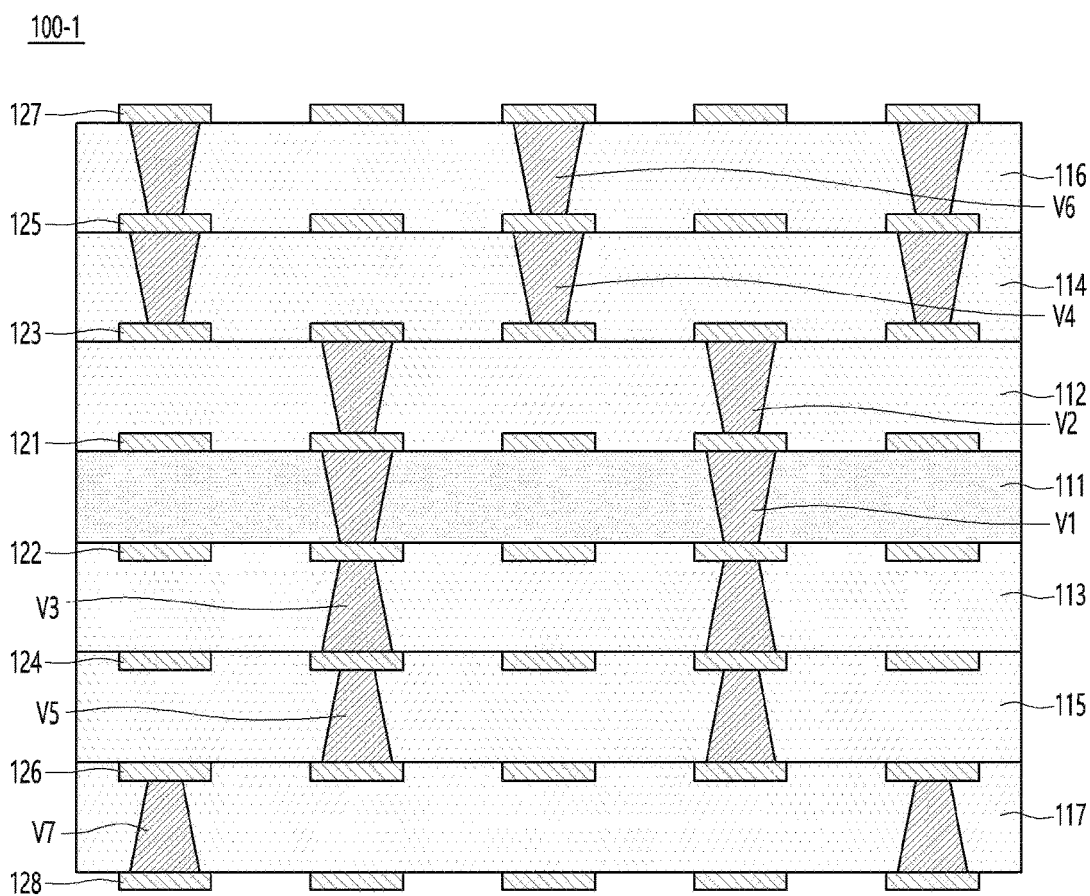

【FIG. 10】
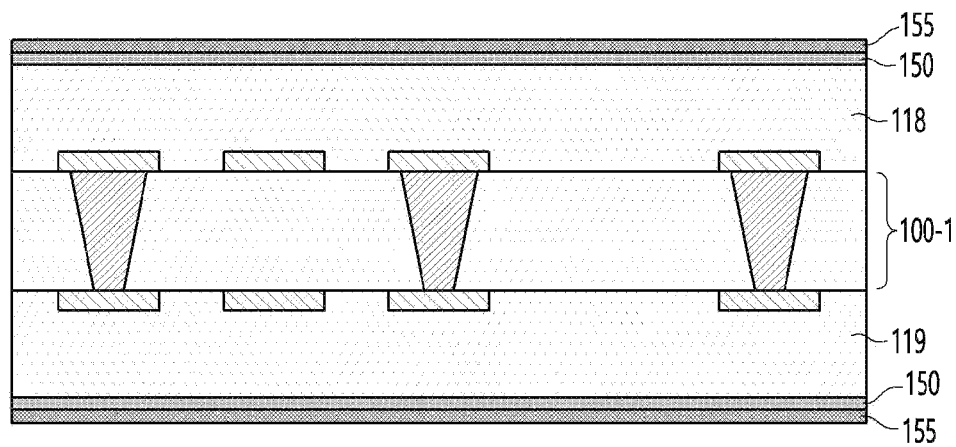
【FIG. 11】
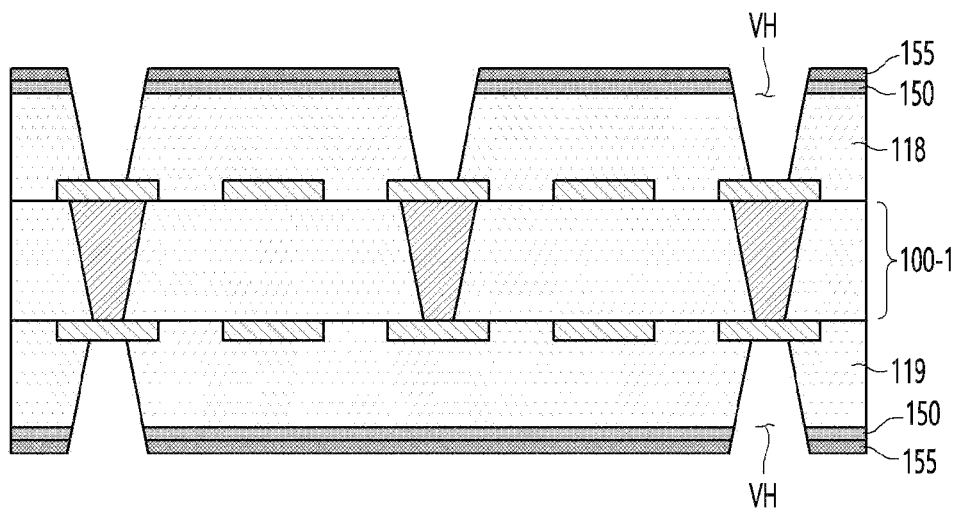

【FIG. 12】
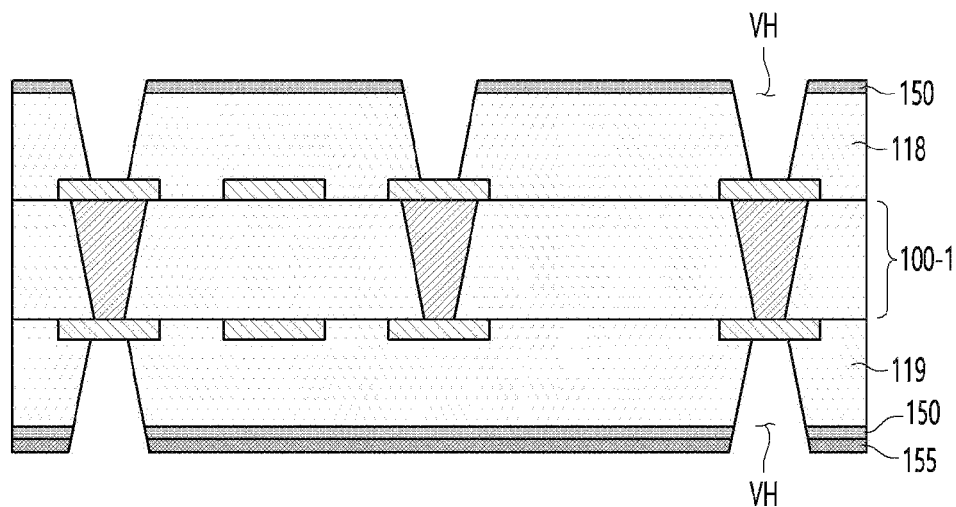
【FIG. 13】
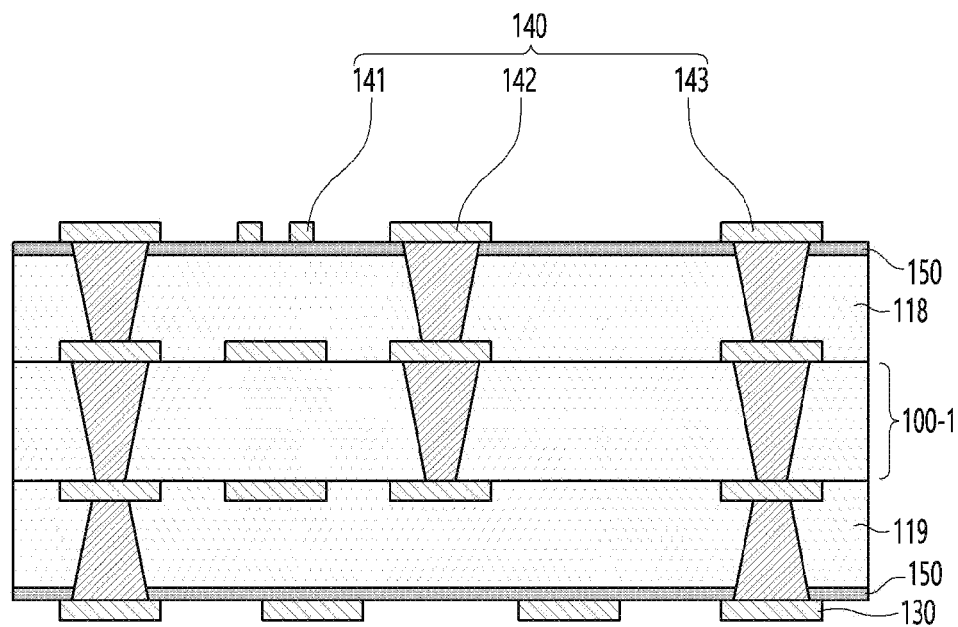

【FIG. 14】
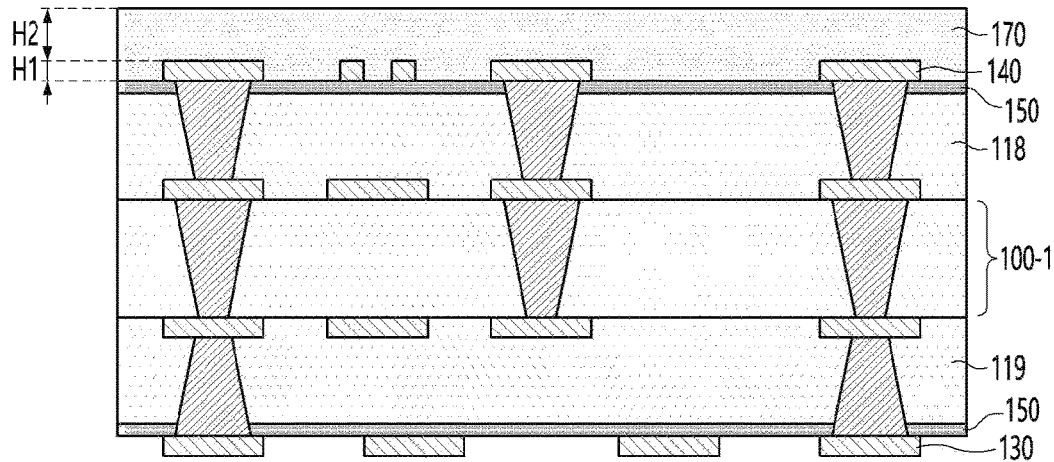
【FIG. 15】
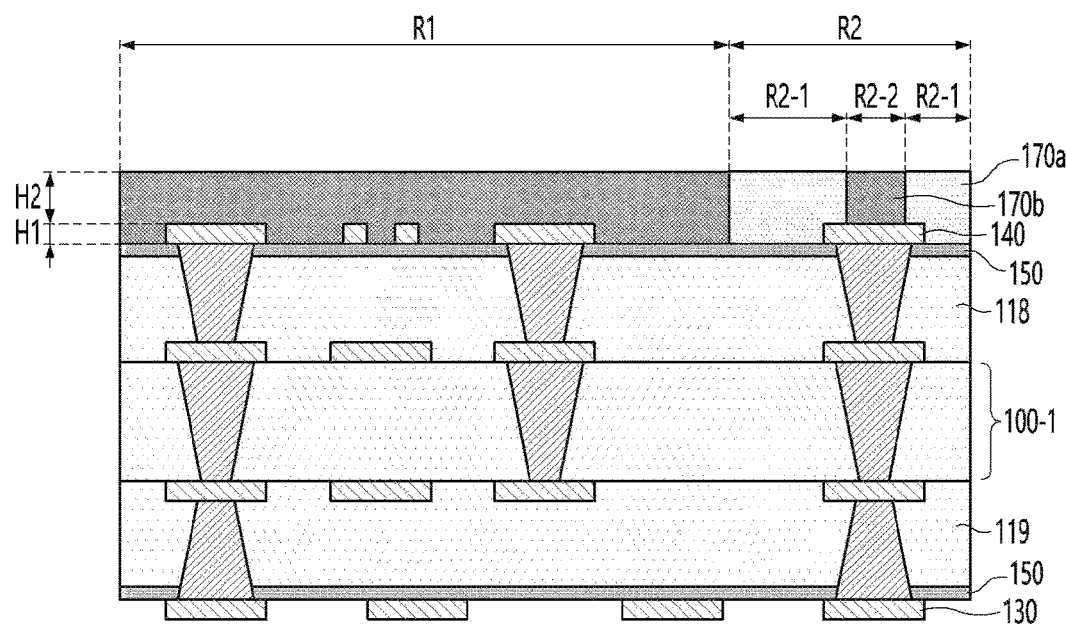

[FIG. 16]
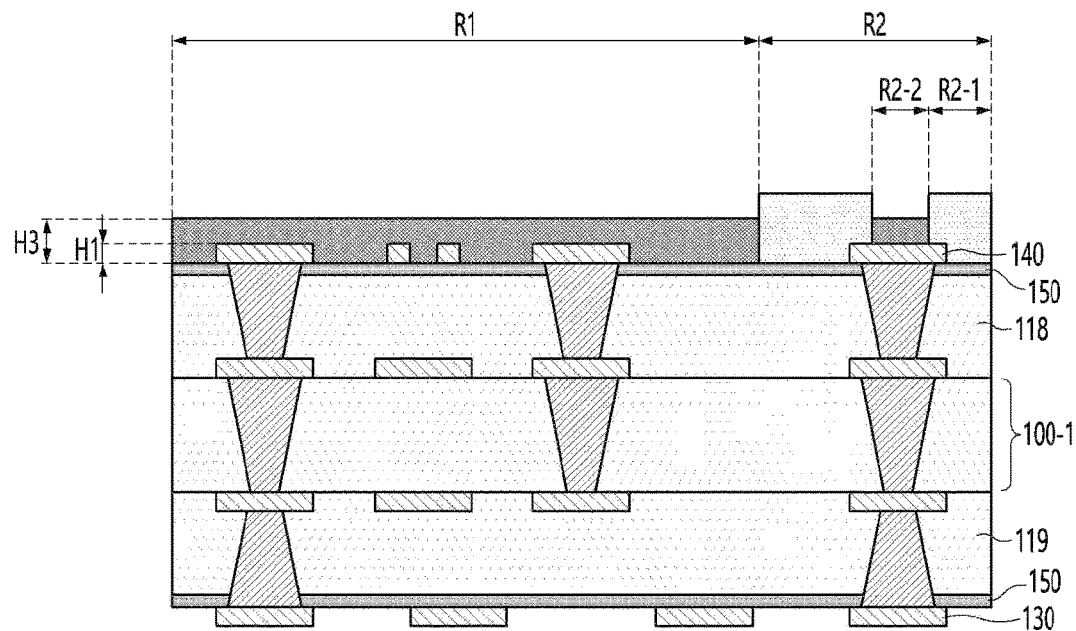
[FIG. 17]
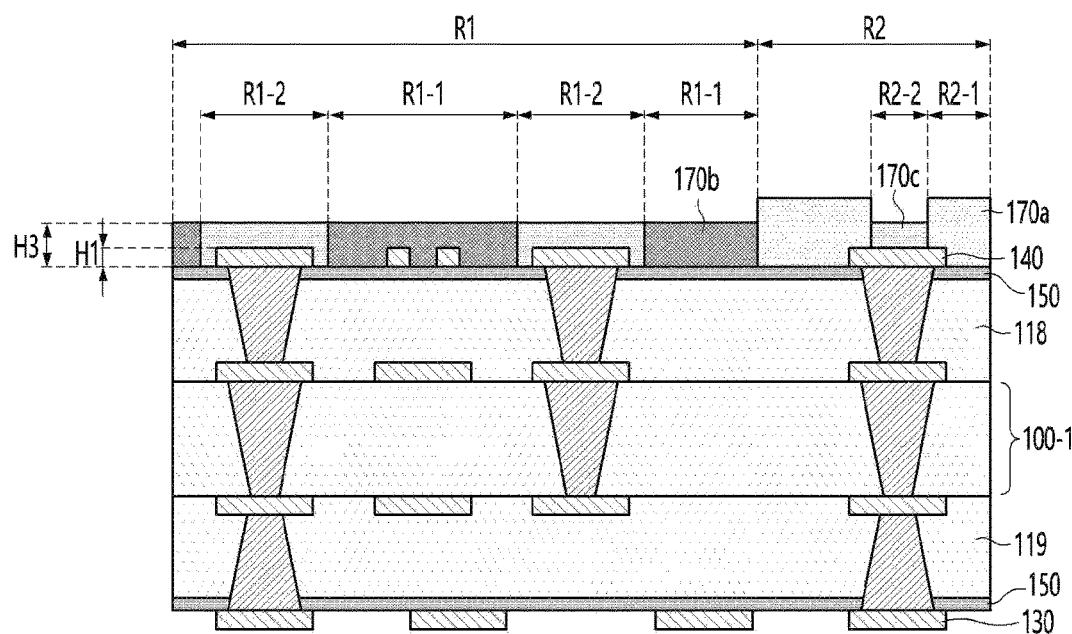

[FIG. 18]
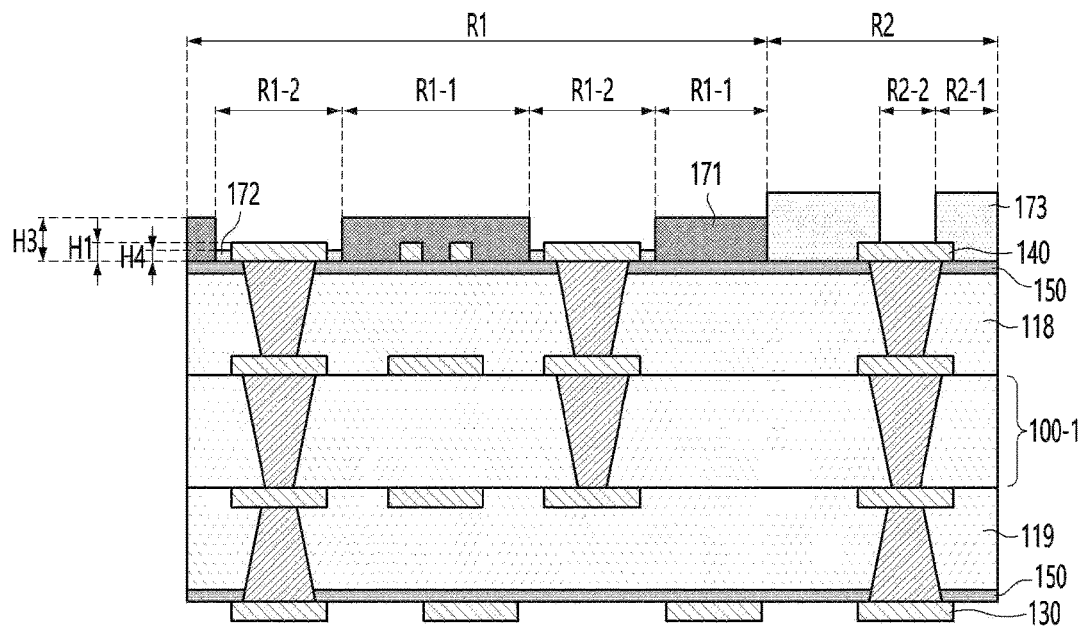
[FIG. 19]
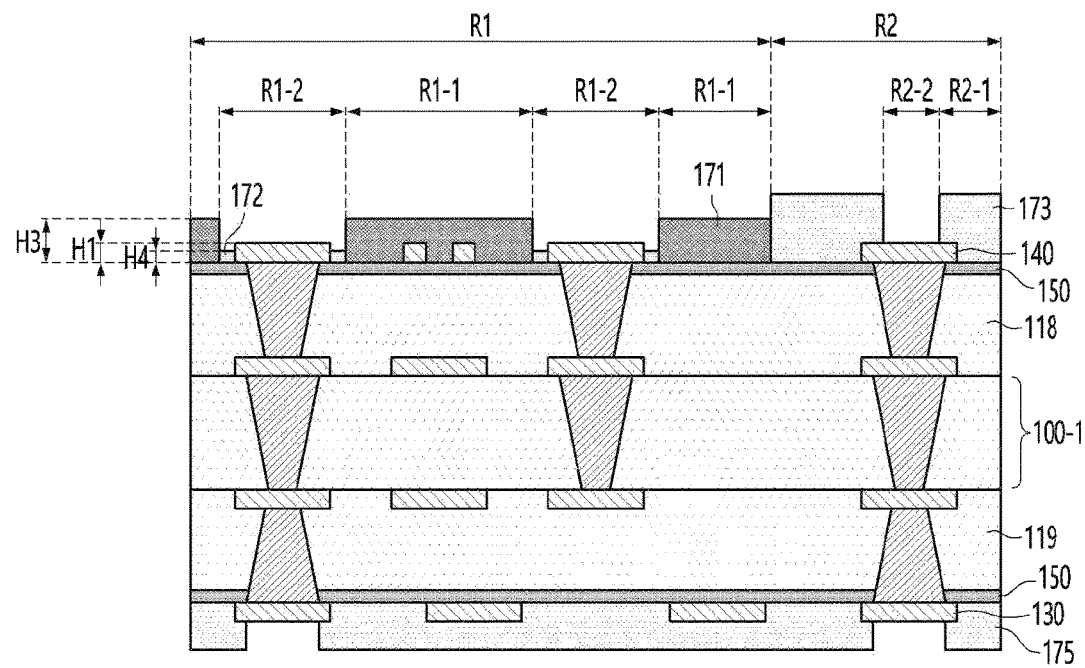

CIRCUIT BOARD

CROSS-REFERENCE TO RELATED PATENT APPLICATIONS

This application is a U.S. National Stage Application under 35 U.S.C. § 371 of PCT Application No. PCT/KR2021/004928, filed Apr. 20, 2021, which claims priority to Korean Patent Application No. 10-2020-0047340, filed Apr. 20, 2020, whose entire disclosures are hereby incorporated by reference.

TECHNICAL FIELD

The embodiment relates to a circuit board, and more particularly, to a circuit board capable of supporting and protecting a circuit pattern of an outermost layer in an open region using a solder resist and a method of manufacturing the same.

BACKGROUND ART

As miniaturization, weight reduction, and integration of an electronic component are accelerated, a line width of a circuit has been made fine. In particular, as a design rule of a semiconductor chip is integrated on a nanometer scale, a circuit line width of a package substrate or a printed circuit board on which the semiconductor chip is mounted has been made fine to several micrometers or less.

Various methods have been proposed in order to increase the degree of circuit integration of the printed circuit board, that is, to reduce the circuit line width. For the purpose of preventing loss of the circuit line width in an etching step for forming a pattern after copper plating, a semi-additive process (SAP) method and a modified semi-additive process (MSAP) have been proposed.

Then, an embedded trace substrate (hereinafter referred to as "ETS") method for embedding a copper foil in an insulating layer in order to implement a fine circuit pattern has been used in the industry. In the ETS method, instead of forming a copper foil circuit on a surface of the insulating layer, the copper foil circuit is manufactured in an embedded form in the insulating layer, and thus there is no circuit loss due to etching and it is advantageous for making the circuit pitch fine.

Meanwhile, recently, in order to meet a demand for wireless data traffic, efforts have been made to develop an improved 5G (5th generation) communication system or a pre-5G communication system. Here, the 5G communication system uses ultra-high frequency (mmWave) bands (sub 6 GHz, 28 GHz, 38 GHz, or higher frequencies) to achieve high data transfer rates.

In addition, in order to reduce a path loss of radio waves and increase a transmission distance of radio waves in the ultra-high frequency band, in the 5G communication system, integration technologies such as beamforming, massive multi-input multi-output (massive MIMO), and array antennas have been developed. Considering that it may be composed of hundreds of active antennas of wavelengths in the frequency bands, an antenna system becomes large relatively.

Since such an antenna and AP module are patterned or mounted on the printed circuit board, low loss on the printed circuit board is very important. This means that several substrates constituting the active antenna system, that is, an antenna substrate, an antenna power feeding substrate, a transceiver substrate, and a baseband substrate, should be integrated into one compact unit.

In addition, the circuit board applied to the 5G communication system as described above is manufactured in a trend of light, thin and compact, and accordingly, the circuit pattern is becoming gradually finer.

However, a circuit board including a conventional fine circuit pattern has a structure in which a circuit pattern disposed at an outermost portion protrudes above an insulating layer, and thus there is problem that the circuit pattern of the outermost portion easily collapses.

DISCLOSURE

Technical Problem

An embodiment provides a circuit board having a new structure and a method of manufacturing the same.

In addition, the embodiment provides a circuit board capable of supporting and protecting the outermost circuit pattern included in the SR open region using a solder resist and a method of manufacturing the same.

In addition, in the embodiment, a circuit board including a solder resist having a layered structure having a different height for each area by performing a stepwise exposure and development process of the solder resist and a method for manufacturing the same are provided.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A circuit board according to an embodiment includes: an insulating layer including first to third regions; an outer layer circuit pattern disposed on upper surfaces of the first to third regions of the insulating layer; and a solder resist including a first part disposed in the first region of the insulating layer, a second part disposed in the second region of the insulating layer, and a third part disposed in the third region of the insulating layer, wherein the outer layer circuit pattern has a first height, the third part of the solder resist is disposed on an upper surface of the outer layer circuit pattern to have a second height, the first region includes a first sub-region and a second sub-region, the first part includes a first sub-part disposed in the first sub-region and a second sub-part disposed in the second sub-region, an upper surface of the first sub-part is positioned higher than the upper surface of the outer layer circuit pattern and lower than an upper surface of the third part, an upper surface of the second sub-part is positioned lower than the upper surface of the outer layer circuit pattern, and a surface roughness of the third part of the solder resist is different from a surface roughness of the first part of the solder resist.

In addition, the first sub-region is a region where a trace is disposed among outer layer circuit patterns, and the second sub-region is a region where a first pad is disposed among the outer layer circuit patterns.

In addition, the second region is a region where a second pad is disposed among the outer layer circuit patterns, and a width of the second pad is greater than a width of the first pad.

In addition, the second sub-part is disposed in contact with at least one of outer surfaces of the first pad.

In addition, the second sub-part includes a first portion disposed on a first outer surface of the first pad and a second portion disposed on a second outer surface opposite to the first outer surface of the first pad, a width of the first portion is equal to a width of the second portion, and the width of the first portion or the second portion is in a range of 10 μm to 12 μm.

In addition, the second sub-part includes a first portion disposed on a first outer surface of the first pad and a second portion disposed on a second outer surface, opposite to the first outer surface, of the first pad, a width of the first portion is different from a width of the second portion, and a sum of widths of the first part and the second part is in a range of 20 μm to 24 μm.

In addition, the second sub-part includes a first portion disposed on a first outer surface of the first pad, a second outer surface of the first pad, opposite to the first outer surface, is in direct contact with the first sub-part, and a width of the first portion is in a range of 20 μm to 24 μm.

In addition, a height of the second sub-part satisfies a range of 70% to 90% of a height of the first pad.

In addition, the second height of the third part protruding from the outer layer circuit pattern satisfies a range of 7 μm to 17 μm.

In addition, the third part of the solder resist is disposed on an upper surface of the second pad to have the second height and includes an opening exposing the upper surface of the second pad, and a width of the opening is smaller than the width of the second pad.

In addition, a centerline surface roughness Ra of the upper surface of the first sub-part or the second sub-part is greater than a centerline surface roughness Ra of the upper surface of the third part.

In addition, the first region and the second region are open regions of the solder resist.

In addition, the insulating layer includes a plurality of insulating layers, the outer layer circuit pattern is disposed to protrude on an upper surface of an uppermost insulating layer among the plurality of insulating layers, and the circuit board includes a primer layer disposed between the uppermost insulating layer, the outer layer circuit pattern, and the solder resist.

Meanwhile, a method of manufacturing a circuit board according to an embodiment includes manufacturing an inner layer substrate, forming an uppermost insulating layer of which a primer layer is disposed on an upper surface thereof on the inner layer substrate, forming an outer layer circuit pattern on the primer layer of the uppermost insulating layer, forming a solder resist covering the outer layer circuit pattern on the primer layer and divided into a first region, a second region, and a third region, primarily exposing a region of the solder resist excluding the first region and an opening of the second region, primarily developing the first region and the opening excluding the primary exposed region, secondary exposing a first sub-region of the primarily developed first region, and secondary developing a second sub-region of the first region and the opening excluding the secondary exposed region, wherein the solder resist includes a first sub-part disposed in the first sub-region, a second sub-part disposed in the second sub-region, a second part disposed in the second region, and a third part disposed in the third region, the outer layer circuit pattern has a first height, the third part of the solder resist is disposed to have a second height above an upper surface of the outer layer circuit pattern, an upper surface of the first sub-part is disposed higher than the upper surface of the outer layer circuit pattern and lower than an upper surface of the third part, an upper surface of the second sub-part is lower than the upper surface of the outer layer circuit pattern, and a surface roughness of the third part of the solder resist is different from a surface roughness of the first part of the solder resist.

In addition, the first sub-region is a region where a trace is disposed among outer layer circuit patterns, the second sub-region is a region where a first pad is disposed among the outer layer circuit patterns, and the second region is a region where a second pad is disposed among the outer layer circuit patterns, a width of the second pad is greater than a width of the first pad, the first pad includes a mounting pad on which a device is mounted, and the second pad includes a BGA pad or a core pad.

In addition, the second sub-part is disposed in contact with at least one of outer surfaces of the first pad, a width of the second sub-region is greater than the width of the first pad, and the width of the second sub-region has a range of 20 μm to 24 μm.

In addition, a height of the second sub-part satisfies a range of 70% to 90% of a height of the first pad.

In addition, the third part of the solder resist is disposed on an upper surface of the second pad to have the second height and includes an opening exposing the upper surface of the second pad, and a width of the opening is smaller than the width of the second pad.

In addition, a centerline surface roughness Ra of the upper surface of the first sub-part or the second sub-part is greater than a centerline surface roughness Ra of the upper surface of the third part.

Advantageous Effects

A circuit board in the embodiment is a circuit board having a structure of multi-layers with eight or more layers and includes an outer layer circuit pattern disposed on an outer insulating layer positioned at an uppermost portion among the multi-layers and protruding above a surface of the outer insulating layer. In this case, the outer layer circuit pattern includes a first outer layer circuit pattern positioned in first and second regions where a solder resist is not disposed and a second outer layer circuit pattern positioned in a third region where the solder resist is disposed. In this case, the second outer layer circuit pattern may be supported and protected by the solder resist, but the first outer layer circuit pattern does not have a support layer capable of supporting the first outer layer circuit pattern, and thus there is a problem that the first outer layer circuit pattern may easily collapse due to various factors.

Accordingly, in the embodiment, the solder resist in the first and second regions is not entirely removed and remains, thereby supporting and protecting the first outer layer circuit pattern by the solder resist. Accordingly, in the embodiment, it is possible to solve problems such as collapsing or rubbing of the first outer layer circuit pattern of the first and second regions by making the outer layer circuit pattern fine, thereby improving product reliability. In particular, in the embodiment, it is possible to solve problems such as collapsing or rubbing of a trace included in the first outer layer circuit pattern in the first region, thereby improving the product reliability.

Meanwhile, the solder resist according to the embodiment includes a first part disposed in the first region, a second part disposed in the second region, and a third part disposed in the third region. In addition, the second part may have an opening and have the same height as the third part. In addition, the first part includes a first sub-part having a height lower than those of the second part and the third part and a sub-part having a height lower than that of the first sub-part. The first sub-part may be formed to cover a surface of the trace of the first outer layer circuit pattern disposed in the first region. In addition, the second sub-part may have a height lower than that of a first pad while exposing a surface of the first pad of the first outer layer circuit pattern disposed in the first region. That is, in the embodiment, the first sub-part, the second sub-part, the second part, and the third part are formed by exposing and developing the solder resist in two steps. Accordingly, in the embodiment, resolution of the exposing may be improved. In addition, in the embodiment, the surface of the trace may be stably protected through the first sub-part in the first region, thereby improving the product reliability.

In addition, in the embodiment, both the surface of the insulating layer or the surface of the primer layer has a structure of being covered by the solder resist, and accordingly, it is possible to solve a problem in reliability due to exposure of the surface of the insulating layer or a part of the primer layer. In detail, the exposure of the surface of the insulating layer or a part of the primer layer refers that a certain space exists between the outer layer circuit pattern and the solder resist. In addition, when the certain space exists, a residual solution such as an adhesive member remains in the space or a void is generated due to the residual solution, thereby causing a problem in reliability. On the other hand, in the embodiment, the space may be filled with the solder resist, thereby solving the reliability problem.

In addition, in the embodiment, the second sub-part of the solder resist is disposed around the first pad, and the first sub-part is disposed around the second sub-part. In addition, the first sub-part may prevent movement of an adhesive member (e.g., a solder ball) to be disposed on the first pad. That is, the first sub-part serves as a dam capable of fixing a position of the adhesive member. Accordingly, in the embodiment, it is possible to solve a problem in reliability such as a short circuit caused by a part of the adhesive member flowing down.

In addition, in the embodiment, in removing the solder resist, an exposure and development method are used instead of sand blasting or a plasma method. In this case, when the solder resist is removed by sandblasting or the plasma method, deformation of the outer layer circuit pattern may occur, and in some cases, the cross-section of the outer layer circuit pattern may have a triangular shape. In addition, when the cross-section of the outer layer circuit pattern has the triangular shape, the adhesive member may not be stably disposed on the outer layer circuit pattern, thereby causing the reliability problem. On the contrary, in the embodiment, the solder resist may be removed without deformation of the outer layer circuit pattern, thereby improving reliability.

In addition, the circuit board in the embodiment may be applied to a 5G communication system, and accordingly, transmission loss of a high frequency can be minimized, thereby further improving the reliability. Specifically, the circuit board in the embodiment can be used at the high frequency and can reduce wave loss.

DESCRIPTION OF DRAWINGS

FIGS. 1A and 1B are views showing a circuit board manufactured by an SAP method according to Comparative example.

FIG. 2 is a view showing a circuit board manufactured by a ETS method in Comparative example.

FIG. 3 is a view showing a circuit board according to an embodiment.

FIG. 4 is an enlarged view of region B of FIG. 3.

FIGS. 5A and 5B are enlarged views of a second sub-part according to an embodiment.

FIG. 6A is a view for describing a first shift of the second sub-part according to the embodiment.

FIG. 6B is a view for describing a second shift of the second sub-part according to the embodiment.

FIGS. 7A and 7B are views for describing reliability of a solder resist structure according to an embodiment and Comparative Example.

FIGS. 8A and 8B are views for describing a surface roughness for each part of the solder resist according to the embodiment.

FIGS. 9 to 19 are views showing a method of manufacturing the circuit board shown in FIG. 3 in order of process.

MODES OF THE INVENTION

Hereinafter, the embodiment disclosed in the present specification will be described in detail with reference to the accompanying drawings, but the same or similar components are designated by the same reference numerals regardless of drawing numbers, and repeated description thereof will be omitted. The component suffixes "module" and "part" used in the following description are given or mixed together only considering the ease of creating the specification, and have no meanings or roles that are distinguished from each other by themselves. In addition, in describing the embodiments disclosed in the present specification, when it is determined that detailed descriptions of a related well-known art unnecessarily obscure gist of the embodiments disclosed in the present specification, the detailed description thereof will be omitted. Further, the accompanying drawings are merely for facilitating understanding of the embodiments disclosed in the present specification, the technological scope disclosed in the present specification is not limited by the accompanying drawings, and it should be understood as including all modifications, equivalents and alternatives that fall within the spirit and scope of the present invention.

It will be understood that, although the terms "first," "second," etc. May be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, it will be understood that there are no intervening elements present.

As used herein, a singular expression includes a plural expression, unless the context clearly indicates otherwise.

It will be understood that the terms "comprise", "include", or "have" specify the presence of stated features, integers, steps, operations, elements, components and/or groups thereof disclosed in the present specification, but do not preclude the possibility of the presence or addition of one or more other features, integers, steps, operations, elements, components, and/or groups thereof.

Hereinafter, embodiments of the present invention will be described in detail with reference to the accompanying drawings.

Prior to descriptions of the present embodiment, Comparative example compared with the present embodiment will be described.

FIG. 1 is a view showing a circuit board according to Comparative example.

Referring to FIG. 1A, the circuit board according to Comparative example includes a circuit pattern manufactured by a general SAP method.

Specifically, the circuit board includes an insulating layer 10, a circuit pattern 20, and a protective layer 30.

The circuit pattern 20 is respectively disposed on upper and lower surfaces of the insulating layer 10.

In this case, at least one of the circuit patterns 20 disposed on a surface of the insulating layer 10 includes a fine circuit pattern.

In FIG. 1, the circuit pattern 20 disposed on the upper surface of the insulating layer 10 includes a fine circuit pattern. The fine circuit pattern includes a trace 21 that is a signal transmission wiring line and a pad 22 for mounting a chip and the like.

In this case, in the embodiment, since a supporting layer using a solder resist is formed for protecting the fine circuit pattern, a structure in a region where the fine circuit pattern is formed in Comparative example will be described.

In addition, a protective layer 30 for protecting the circuit pattern 20 is disposed on the surface of the insulating layer 10.

In this case, an upper region of the insulating layer 10 includes a first region where the protective layer 30 is disposed and a second region that is an open region where the protective layer 30 is not disposed.

Accordingly, a part of the circuit pattern 20 disposed on the upper surface of the insulating layer 10 is covered by the protective layer 30, and the remaining part is exposed to the outside without being covered by the protective layer 30.

In this case, the trace 21 and the pad 22 corresponding to the fine circuit pattern as described above are disposed in the second region that is the open region of the protective layer 30.

For example, at least one of the trace 21 and the pad 22 is formed in a width/interval of 15 µm/15 µm or less.

In this case, when the circuit pattern formed in the open region of the protective layer 30 is a pattern having a width exceeding 15 µm rather than a fine circuit pattern, the circuit pattern may be strong against external impact.

However, as shown in FIG. 1B, as the circuit pattern gradually becomes finer, the width and interval of the trace 21 and the pad 22, which are the fine circuit patterns of the outermost layer, gradually decrease, and accordingly, when the fine circuit pattern protruding above the upper surface of the insulating layer 10 is disposed in the second region that is the open region of the protective layer, there is a problem that the fine circuit pattern easily collapses due to an external impact.

That is, as in B of FIG. 1B, the trace 21 corresponding to the fine circuit pattern of the outermost layer has an extremely fine pattern shape, and thus a problem of easily collapsing or rubbing occurs even with a small external impact.

Meanwhile, recently, the fine circuit pattern disposed in the open region of the protective layer while having a structure buried in the insulating layer is formed by using a ETS method.

FIG. 2 is a view showing a circuit board manufactured by the ETS method in Comparative example.

Referring to FIG. 2, specifically, the circuit board includes an insulating layer 10A, a circuit pattern 20A, and a protective layer 30A.

The circuit pattern 20A is respectively disposed on upper and lower surfaces of the insulating layer 10A.

In this case, at least one of the circuit patterns 20A disposed on a surface of the insulating layer 10A includes a fine circuit pattern.

Here, when the circuit pattern is formed by the ETS method, the circuit pattern formed at first has a structure buried in the insulating layer 10A. Accordingly, when the circuit pattern formed at first is formed as a fine circuit pattern, the fine circuit pattern may have a structure in which the fine circuit pattern is buried in the insulating layer 10A even in Comparative example.

That is, the circuit board manufactured by the ETS method includes a fine circuit pattern having a structure buried in the surface of the insulating layer 10A. That is, the fine circuit pattern includes a trace 21A that is a signal transmission wiring line and a pad 22A for mounting a chip or the like.

In addition, when the circuit board is manufactured by the ETS method as described above, since the fine circuit pattern has the structure buried in the insulating layer, the fine circuit pattern may be protected from an external impact.

In this case, for a substrate having a two-layer structure (based on the number of layers of the circuit pattern) as in FIG. 2, there is no major problem in manufacturing the circuit board by the ETS method. However, in case of manufacturing a circuit board having eight or more layers, in particular, ten or more layers by the ETS method, a lead time for manufacturing the same takes at least 2 months or more, and thus there is a problem that productivity is lowered.

In addition, in order to manufacture the fine circuit pattern of the buried structure by the ETS method, the fine circuit pattern should be formed at first during a manufacturing process of a multilayer circuit board. In addition, recently, in order to be applied to an AP module having high integration/high specification, etc., a circuit board having eight to ten layers are required. In this case, in a process of forming the fine circuit pattern at first during the ETS process and then performing a multilayer stacking process, damage is applied to the fine circuit pattern due to a thermal stress, etc., and thus there is a problem that it is difficult to normally implement the fine circuit pattern.

In addition, when the circuit board is manufactured by the ETS method, an ETS core layer is separately required. In this case, when the circuit board is manufactured by the ETS method, an additional process for finally removing the ETS core layer is required.

In addition, when the circuit board is manufactured by the ETS method, there is a problem that a yield is lowered due to a cumulative tolerance when layers are stacked more than a certain number of times, and accordingly, product costs increase, and there is a problem that pattern damage increases due to stress as the stacking process is respectively performed on both surfaces around the ETS core layer.

In addition, with the development of 5G technology in recent years, interest in circuit boards that may reflect the same is increasing. In this case, in order to apply the 5G technology, the circuit board should have a high multi-layer structure, and accordingly, the circuit pattern should be made fine. However, in Comparative example, it is possible to form the fine pattern, but there is a problem that it is not possible to stably protect the fine pattern.

Accordingly, the embodiment is directed to providing a circuit board of a new structure capable of solving the reliability problem of the fine pattern disposed at the outermost portion and a control method thereof.

FIG. 3 is a view showing a circuit board according to an embodiment, and FIG. 4 is an enlarged view of region B of FIG. 3.

Prior to descriptions of FIGS. 3 and 4, the circuit board of the present embodiment, the circuit board according to the embodiment may have a multilayer structure. Preferably, the circuit board according to the embodiment may have a structure of ten or more layers based on a number of layers of the circuit pattern. However, this is merely an example and the embodiment is not limited thereto. That is, the circuit board in the embodiment may have a number of layers smaller than ten layers, or alternatively, the circuit board may have a number of layers greater than ten layers.

However, the circuit board in the embodiment is for solving problems of the ETS method in Comparative example. In this case, the ETS method in Comparative example has a problem that it takes a lot of time to manufacture a circuit board having eight or more layers, and accordingly, in the embodiment, it will be described as having a ten-layer structure for comparison therewith.

Referring to FIGS. 3 to 4, a circuit board 100 includes an insulating layer 110.

Preferably, the circuit board 100 may include first to ninth insulating layers 111, 112, 113, 114, 115, 116, 117, 118, and 119 in order to implement a ten-layer structure.

In this case, the first insulating layer 111, the second insulating layer 112, the third insulating layer 113, the fourth insulating layer 114, the fifth insulating layer 115, the sixth insulating layer 116, and the seventh insulating layer 117 of the insulating layer 110 may be an internal insulating layer disposed inside in a stacked insulating layer structure, and the eighth insulating layer 118 may be an uppermost insulating layer (a first outermost insulating layer) disposed on an inner insulating layer, and the ninth insulating layer 119 may be a lowermost insulating layer (a second outermost insulating layer) disposed under the inner insulating layer.

The first insulating layer 111 may be a core insulating layer disposed at a center in the stacked structure of the insulating layer 110. The second insulating layer 112, the fourth insulating layer 114, the sixth insulating layer 116, and the eighth insulating layer 118 may be upper insulating layers sequentially disposed on the first insulating layer 111. In addition, the third insulating layer 113, the fifth insulating layer 115, the seventh insulating layer 117, and the ninth insulating layer 119 may be lower insulating layers sequentially disposed under the first insulating layer 111.

The insulating layer 110 may be a substrate on which an electric circuit capable of changing wiring is formed and may include all of a printed circuit board, a wiring board, and an insulating substrate made of an insulating material capable of forming circuit patterns on a surface thereof.

For example, the insulating layer 110 may be rigid or flexible. For example, the insulating layer 110 may include glass or plastic. Specifically, the insulating layer 110 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire.

Further, the insulating layer 110 may include an optically isotropic film. As an example, the insulating layer 110 may include cyclic olefin copolymer (COC), cyclic olefin polymer (COP), optically isotropic PC, optically isotropic polymethylmethacrylate (PMMA), or the like.

In addition, at least one of the insulating layer 110 may be partially bent while having a curved surface. That is, at least one of the insulating layer 110 may partially have a plane and may partially be bent while having a curved surface. Specifically, an end portion of at least one of the insulating layer 110 may be bent while having a curved surface, or bent or crooked while having a surface with a random curvature.

In addition, at least one of the insulating layer 110 may be a flexible substrate having flexibility. Further, at least one of the insulating layer 110 may be a curved or bent substrate. In this case, at least one of the insulating layer 110 may form a wiring layout for electrical wirings which connect circuit components based on a circuit design, and electrical conductors may be disposed on an insulating material. Further, electrical components may be mounted on at least one of the insulating layer 110, and the insulating layer 110 may form wirings configured to connect the electrical components to make a circuit, and may mechanically fix the components besides functioning to electrically connect the components.

A circuit pattern may be disposed on a surface of the insulating layer 110.

That is, circuit patterns may be disposed on respective surfaces of the first to ninth insulating layers 111, 112, 113, 114, 115, 116, 117, 118, and 119 constituting the insulating layer 110.

Here, the circuit pattern may include an inner layer circuit pattern 120 and outer layer circuit patterns 130 and 140. The inner layer circuit pattern 120 may be a circuit pattern disposed inside the insulating layer 110 in the stacked structure of the circuit board, and the outer layer circuit patterns 130 and 140 may be a circuit pattern disposed on an outermost side of the insulating layer 110 in the stacked structure of the circuit board.

The inner layer circuit pattern 120 may include a first circuit pattern 121, a second circuit pattern 122, a third circuit pattern 123, a fourth circuit pattern 124, a fifth circuit pattern 125, and a sixth circuit pattern 126, and a seventh circuit pattern 127.

The first circuit pattern 121 may be disposed on an upper surface of the first insulating layer 111, and thus the first circuit pattern 121 may be covered by the second insulating layer 112. The second circuit pattern 122 may be disposed on a lower surface of the first insulating layer 111, and thus the second circuit pattern 122 may be covered by the third insulating layer 113. The third circuit pattern 123 may be disposed on an upper surface of the second insulating layer 112, and thus the third circuit pattern 123 may be covered by the fourth insulating layer 114. The fourth circuit pattern 124 may be disposed on a lower surface of the third insulating layer 113, and thus the fourth circuit pattern 124 may be covered by the fifth insulating layer 115. The fifth circuit pattern 125 may be disposed on an upper surface of the fourth insulating layer 114, and thus the fifth circuit pattern 125 may be covered by the sixth insulating layer 116. The sixth circuit pattern 126 may be disposed on a lower surface of the fifth insulating layer 115, and thus the sixth circuit pattern 126 may be covered by the seventh insulating layer 117. The seventh circuit pattern 127 may be disposed on an upper surface of the sixth insulating layer 116, and thus the seventh circuit pattern 127 may be covered by the eighth insulating layer 118. The eighth circuit pattern 128 may be disposed on a lower surface of the seventh insulating layer 117, and thus the eighth circuit pattern 128 may be covered by the ninth insulating layer 119.

The outer layer circuit pattern may be disposed on a surface of the outermost insulating layer disposed on the outermost side of the insulating layer 110. Preferably, the outer layer circuit pattern may include a lower outer layer circuit pattern 130 disposed on a lower surface of the ninth insulating layer 119 disposed at a lowermost portion of the insulating layer 110.

In addition, the outer layer circuit pattern may include an upper outer layer circuit pattern 140 disposed on an upper surface of the eighth insulating layer 118 disposed on an uppermost portion of the insulating layer 110.

In this case, at least one of the lower outer layer circuit pattern 130 and the upper outer layer circuit pattern 140 may be formed to protrude above the surface of the insulating layer. Preferably, the lower outer layer circuit pattern 130 may be formed to protrude below the lower surface of the ninth insulating layer 119. In addition, the upper outer layer circuit pattern 140 may be formed to protrude above the upper surface of the eighth insulating layer 118.

That is, an upper surface of the lower outer layer circuit pattern 130 may be positioned on the same plane as the lower surface of the ninth insulating layer 119. In addition, a lower surface of the upper outer layer circuit pattern 140 may be positioned on the same plane as an upper surface of the primer layer 150 disposed on an upper surface of the eighth insulating layer 180.

In other words, the primer layer 150 may be disposed on the upper surface of the eighth insulating layer 180 and the upper outer layer circuit pattern 140.

That is, the upper outer layer circuit pattern 140 may include a fine circuit pattern. Preferably, the upper outer layer circuit pattern 140 may be a fine circuit pattern having a line width of 10 μm or less and an interval between patterns of 10 μm or less. Accordingly, when the upper outer layer circuit pattern 140 is directly disposed on the eighth insulating layer 118, a contact area between the eighth insulating layer 118 and the upper outer layer circuit pattern 140 is small, and thus a situation in which the upper outer layer circuit pattern 140 is separated from the eighth insulating layer 118 may occur.

Therefore, in the embodiment, the primer layer 150 is disposed between the upper outer layer circuit pattern 140 and the eighth insulating layer 118. The primer layer 150 may improve bonding force between the upper outer layer circuit pattern 140 and the eighth insulating layer 118. The primer layer 150 may be disposed to entirely cover the upper surface of the eighth insulating layer 118. In addition, the upper outer layer circuit pattern 140 may be partially disposed on the primer layer 150. Therefore, the upper surface of the primer layer 150 in a first embodiment may include a first portion in contact with the upper outer layer circuit pattern 140 and a second portion in contact with a lower surface of a support insulating layer 160 to be described later. That is, when the upper outer layer circuit pattern 140 by the SAP process is formed, the primer layer 150 may serve to strengthen bonding force between the eighth insulating layer 118 and the upper outer layer circuit pattern 140. Such a primer layer 150 may include a polyurethane-based resin, an acrylic resin, or a silicone-based resin, but the embodiment is not limited thereto.

Meanwhile, it is illustrated in FIG. 3 that the primer layer is not disposed between the ninth insulating layer 119 and the lower outer layer circuit pattern 130, but the primer layer may also be formed between the ninth insulating layer 119 and the lower outer layer circuit pattern 130. However, the lower outer layer circuit pattern 130 may not be the fine circuit pattern, and accordingly, the primer layer between the ninth insulating layer 119 and the lower outer layer circuit pattern 130 may be selectively omitted.

Consequently, when the fine circuit pattern is disposed on the inner layer, the primer layer may be omitted as the circuit pattern is covered by at least one of the insulating layers 110. On the other hand, in the embodiment, when the fine circuit pattern is disposed on the outermost layer, since there is no insulating layer covering the fine circuit pattern, the primer layer 150 is disposed in order to improve bonding force between the fine circuit pattern and the insulating layer.

Hereinafter, it will be described that the upper outer layer circuit pattern 140 is formed of a fine circuit pattern. However, the embodiment is not limited thereto, and the lower outer layer circuit pattern 130 may also be formed of the fine circuit pattern. It will be obvious that a structure for improving reliability, such as strengthening bonding force and preventing collapse of the upper outer layer circuit pattern 140 described below, may also be applied to the lower outer layer circuit pattern 130.

The inner layer circuit pattern 120, the lower outer layer circuit pattern 130, and the upper outer layer circuit pattern 140 may be wirings that transmit electrical signals and may be formed of a metal material having high electrical conductivity. To this end, the inner circuit pattern 120, the lower outer layer circuit pattern 130, and the upper outer layer circuit pattern 140 may be formed of at least one metal material selected from among gold (Au), silver (Ag), platinum (Pt), titanium (Ti), tin (Sn), copper (Cu), and zinc (Zn). In addition, the inner circuit pattern 120, the lower outer layer circuit pattern 130, and the upper outer layer circuit pattern 140 may be formed of paste or solder paste including at least one metal material selected from among gold (Au), silver (Ag), platinum (Pt), titanium (Ti), tin (Sn), copper (Cu), and zinc (Zn), which are excellent in bonding force. Preferably, the inner circuit pattern 120, the lower outer layer circuit pattern 130, and the upper outer layer circuit pattern 140 may be formed of copper (Cu) having high electrical conductivity and a relatively low cost.

At least one of the inner layer circuit pattern 120, the lower outer layer circuit pattern 130, and the upper outer layer circuit pattern 140 may be formed by a general process of manufacturing a circuit board, such as an additive process, a subtractive process, a modified semi additive process (MSAP), a semi additive process (SAP), etc., and detailed descriptions thereof will be omitted herein.

Preferably, the lower outer layer circuit pattern 130 and the upper outer layer circuit pattern 140 are outermost circuit patterns disposed on the outermost side of the circuit board, and thus they may be formed by the SAP (Semi Additive Process) method.

Meanwhile, a via V may be disposed in the insulating layer 110. The vias V are disposed in each insulating layer, and thus the via V may serve to electrically connect circuit patterns disposed in different layers to each other.

A first via V1 may be disposed in the first insulating layer 111. The first via V1 may electrically connect the first circuit pattern 121 disposed on the upper surface of the first insulating layer 111 and the second circuit pattern 122 disposed on the lower surface of the first insulating layer 111.

A second via V2 may be disposed in the second insulating layer 112. The second via V2 may electrically connect the first circuit pattern 121 disposed on the upper surface of the first insulating layer 111 and the third circuit pattern 123 disposed on the upper surface of the second insulating layer 112.

A third via V3 may be disposed in the third insulating layer 113. The third via V3 may electrically connect the second circuit pattern 122 disposed on the lower surface of the first insulating layer 111 and the fourth circuit pattern 124 disposed on the lower surface of the third insulating layer 113.

A fourth via V4 may be disposed in the fourth insulating layer 114. The fourth via V4 may electrically connect the third circuit pattern 123 disposed on the upper surface of the second insulating layer 111 and the fifth circuit pattern 125 disposed on the upper surface of the fourth insulating layer 114.

A fifth via V5 may be disposed in the fifth insulating layer 115. The fifth via V5 may electrically connect the fourth circuit pattern 124 disposed on the lower surface of the third insulating layer 113 and the sixth circuit pattern 126 disposed on the lower surface of the fifth insulating layer 115.

A sixth via V6 may be disposed in the sixth insulating layer 116. The sixth via V6 may electrically connect the fifth circuit pattern 125 disposed on the upper surface of the fourth insulating layer 114 and the seventh circuit pattern 127 disposed on the upper surface of the sixth insulating layer 116.

A seventh via V7 may be disposed in the seventh insulating layer 117. The seventh via V7 may electrically connect the sixth circuit pattern 126 disposed on the lower surface of the fifth insulating layer 115 and the eighth circuit pattern 128 disposed on the lower surface of the seventh insulating layer 117.

An eighth via V1 may be disposed in the eighth insulating layer 118. The eighth via V8 may electrically connect the seventh circuit pattern 127 disposed on the upper surface of the sixth insulating layer 116 and the upper outer layer circuit pattern 140 disposed on the upper surface of the primer layer 150.

A ninth via V9 may be disposed in the ninth insulating layer 119. The ninth via V9 may electrically connect the eighth circuit pattern 128 disposed on the lower surface of the seventh insulating layer 117 and the lower outer layer circuit pattern 130 disposed on the lower surface of the ninth insulating layer 119.

The via V as described above may be formed by filling the inside of a via hole formed in each insulating layer with a metal material.

The via hole may be formed by any one of mechanical, laser, and chemical processing method. When the via hole is formed by mechanical processing, a method such as milling, drilling and routing may be used, when the via hole is formed by laser processing, a method of UV or $CO_2$ laser may be used, and when the via hole is formed by chemical processing, the insulating layer 110 may be opened using a chemical including aminosilane, ketone, or the like.

Meanwhile, the laser processing is a cutting method in which a part of a material is melted and evaporated by concentrating optical energy at a surface to take a desired shape. Complex formation by a computer program may be easily processed, and composite materials which are difficult to cut by other methods may be processed.

In addition, the processing by the laser may have a cutting diameter of at least 0.005 mm, and has a wide range of thickness that may be processed.

It is preferable to use an yttrium aluminum garnet (YAG) laser or $CO_2$ laser or ultraviolet (UV) laser as the laser processing drill. The YAG laser is a laser capable of processing both a copper foil layer and an insulating layer, and the $CO_2$ laser is a laser capable of processing only an insulating layer.

When the via hole is formed, the first to ninth vias V1, V2, V3, V4, V5, V6, V7, V8, and V9 may be formed by filling the inside of the through-hole with a conductive material. The metal material forming the first to ninth vias V1, V2, V3, V4, V5, V6, V7, V8, and V9 may be any one material selected from among copper (Cu), silver (Ag), tin (Sn), gold (Au), nickel (Ni), and palladium (Pd), and the conductive material may be filled by any one of electroless plating, electrolytic plating, screen printing, sputtering, evaporation, ink jetting, and dispensing, or a combination thereof.

Meanwhile, a protective layer may be disposed on an outermost side of the circuit board 100. Preferably, a first protective layer 170 may be disposed on the eighth insulating layer 118 (preferably, on the primer layer 150). In addition, a second protective layer 175 may be disposed under the ninth insulating layer 119.

The first protective layer 170 and the second protective layer 175 may be formed of at least one layer using any one or more of solder resist (SR), oxide, and Au. Preferably, the first protective layer 170 and the second protective layer 175 may be a solder resist.

Meanwhile, the first protective layer 170 is disposed on the primer layer 150. The first protective layer 170 may serve to protect a surface of the upper outer layer circuit pattern 140 while supporting the upper outer layer circuit pattern 140 disposed on the primer layer 150.

That is, the first protective layer 170 may partially overlap the upper outer layer circuit pattern 140 disposed on the primer layer 150. An area of the first protective layer 170 may be smaller than an area of the eighth insulating layer 118. The area of the first protective layer 170 may be smaller than an area of the primer layer 150. The first protective layer 170 is partially or entirely disposed on the primer layer 150 and the upper outer layer circuit pattern 140, and thus the first protective layer 170 may include an open region exposing the surface of the upper outer layer circuit pattern 140.

The first protective layer 170 may include an open region having a shape such as a groove. Preferably, the first protective layer 170 includes an open region exposing the upper outer layer circuit pattern 140 disposed in a first region R1 and a second region R2. In this case, the first region R1 and the second region R2 may be open regions in which the surface of the upper outer layer circuit pattern 140 is exposed. That is, a device mounting pad on which a chip device is mounted, a core pad or BGA pad serving as a die for connection with an external board, and a trace serving as a signal transmission line, and the like are included in the first region R1 and the second region R2. In addition, the first protective layer 170 has an open region exposing surfaces of the device mounting pad, the core pad, and the BGA pad in the first region R1 and the second region R2.

Consequently, the first region R1 and the second region R2 may refer a region where the surface of the outer layer circuit pattern 140 is exposed through the first protective layer 170 in upper regions of the primer layer 150 and the upper outer layer circuit pattern 140.

That is, the circuit board includes the first region R1, the second region R2, and a third region R3. The first region R1 and the second region R2 are open regions in which the surface of the upper outer layer circuit pattern 140 should be exposed through the first protective layer 170, and the third region R3 may be a buried region where the surface of the upper outer layer circuit pattern 140 is covered by the protective layer 170.

That is, the first region R1 is a region of the upper outer layer circuit pattern 140 where a first pad 142 and a trace 141 for electrically connecting to components such as chips are disposed among the upper outer layer circuit patterns 140. Therefore, the first protective layer 170 may have an open region exposing a surface of the first pad 142 included in the first region R1. In addition, the second region R2 is a region where a second pad 143 corresponding to the core pad or the BGA pad serving as the die for bonding to the external board is disposed among the upper outer layer circuit patterns 140.

In addition, the upper outer layer circuit pattern 140 disposed in the first region R1 as described above may have a problem in reliability such as collapsing or rubbing due to various factors. Furthermore, the trace 141 constituting the upper outer layer circuit pattern 140 is a fine circuit pattern, and thus the trace 141 has a line width W1 of 10 µm or less and an interval of 10 µm or less and is disposed on the primer layer 150. Accordingly, the trace 141 disposed on the first region R1 may have a problem that it is easily collapsed or rubbed by various small external impacts.

Accordingly, in the embodiment, in order to improve reliability of the upper outer layer circuit pattern 140 disposed on the first region R1, the protective layer 170 is also formed on the primer layer 150 corresponding to the first region R1.

That is, the first protective layer 170 may be disposed in a region of the upper surface of the primer layer 150 where the upper outer layer circuit pattern 140 is not disposed. For example, the first protective layer 170 may be disposed on the upper surface of the primer layer 150, and thus the first protective layer 170 may be disposed between the upper outer layer circuit patterns 140 on the first region R1.

In this case, the upper outer layer circuit pattern 140 includes a first outer layer circuit pattern disposed in the first region R1 and the second region R2 and a second outer layer circuit pattern formed in the third region R3.

In addition, the upper surface of the primer layer 150 may include a first the upper surface corresponding to the first region R1, a second the upper surface corresponding to the second region R2, and a third upper surface corresponding to the third region R3.

In this case, as shown in FIGS. 3 and 4, the first protective layer 170 may be entirely disposed on the primer layer 150 without dividing the first region R1, the second region R2, and the third region R3. That is, the first protective layer 170 may be respectively disposed in a region between the first outer layer circuit patterns and a region between the second outer layer circuit patterns.

Accordingly, the first protective layer 170 includes a first portion disposed in the first region R1, a second portion disposed in the second region R2, and a third portion disposed in the third region R3.

In this case, the first protective layer 170 may have different heights for each region.

In the first region R1 and the second region R2, the surface of the upper outer layer circuit pattern 140 should be exposed to the outside, and in the third region R3, the surface of the upper outer layer circuit pattern 140 should be covered by the protective layer.

Here, the upper outer layer circuit pattern 140 disposed in the first region R1 and the second region R2 may have different widths according to functions. For example, as described above, the upper outer layer circuit pattern 140 disposed in the first region R1 and the second region R2 may include the first pad 142, the second pad 143, and the trace 141.

In this case, the trace 141 may have a width of 10 µm or less. In addition, the first pad may have a width of about 45 µm. In addition, the second pad 143 may have a width W3 of between 100 µm and 300 µm.

Accordingly, in the embodiment, in an open region of the solder resist as described above, the first protective layers 170 having different heights with respect to each of the region where the trace 141 is disposed, the region where the first pad 142 is disposed, and the region where the second pad 143 is disposed are formed.

That is, the first protective layer 170 may include a first part disposed in the first region R1, a second part disposed in the second region R2, and a third part disposed in the third region R3. In addition, at least one of the first part, the second part, and the third part may have a height different from that of at least another one.

For example, an upper surface of the first part disposed in the first region R1 may be positioned lower than upper surfaces of the second part disposed in the second region R2 and the third part disposed in the third region R3.

In addition, the upper surface of the second part may be positioned higher than the upper surface of the first part. In addition, the upper surface of the second part may have the same height as the upper surface of the third part. That is, the upper surface of the second part may be positioned on the same plane as the upper surface of the third part.

In addition, the first part may include a first sub-part and a second sub-part. In addition, heights of upper surfaces of the first sub-part and the second sub-part may be different from each other. For example, the upper surface of the first sub-part may be positioned higher than the upper surface of the second sub-part. In this case, the first sub-part may correspond to a region where the trace 141 is disposed in the first region R1. In addition, the second sub-part may correspond to a region where the first pad 142 is disposed in the first region R1.

Hereinafter, the first protective layer 170 will be described in detail.

The first protective layer 170 may be disposed on the primer layer 150. The first protective layer 170 is a solder resist.

The first protective layer 170 may be disposed between the upper outer layer circuit patterns 140 on the primer layer 150. That is, the upper outer layer circuit pattern 140 is disposed on the primer layer 150 to be spaced apart from each other at a predetermined interval. In addition, the first protective layer 170 may be disposed on a region of the upper surface of the primer layer 150 in which the upper outer layer circuit pattern 140 is not disposed. In addition, the first protective layer 170 may be selectively disposed on the upper outer layer circuit pattern 140.

Hereinafter, the first protective layer 170 will be described as a solder resist 170.

The solder resist 170 may be disposed on the region of the upper surface of the primer layer 150 in which the upper outer layer circuit pattern 140 is not disposed.

Accordingly, the lower surface of the solder resist 170 may be in direct contact with the upper surface of the primer layer 150. In addition, the solder resist 170 may have a structure in direct contact with the upper outer layer circuit pattern 140.

For example, a first part of the solder resist 170 disposed in the first region R1 may be in direct contact with a side surface of the upper outer layer circuit pattern 140. In addition, a part of the first part of the solder resist 170 disposed in the first region R1 may be in direct contact with the upper surface of the upper outer layer circuit pattern 140. In addition, at least a part of the first part of the solder resist 170 disposed in the first region R1 may expose the upper surface and the side surface of the upper outer layer circuit pattern 140.

In addition, a second part of the solder resist 170 disposed in the second region R2 may be in direct contact with the side surface of the upper outer layer circuit pattern 140. In addition, the second part of the solder resist 170 disposed in the second region R2 may be in direct contact with a part of the upper surface of the upper outer layer circuit pattern 140. In addition, the second part of the solder resist 170 disposed in the second region R2 may expose the upper surface of the upper outer layer circuit pattern 140.

In addition, a third part of the solder resist 170 disposed in the third region R3 may be in direct contact with the side surface of the upper outer layer circuit pattern 140. In addition, the third part of the solder resist 170 disposed in the third region R3 may be in direct contact with the upper surface of the upper outer layer circuit pattern 140. That is, the third part of the solder resist 170 disposed in the third region R3 may protrude at a predetermined height above the upper surface of the upper outer layer circuit pattern 140 and may be disposed to cover the upper outer layer circuit pattern 140. In detail, the third part of the solder resist 170 disposed in the third region R3 may be disposed to surround the side surface and the upper surface of the upper outer layer circuit pattern 140.

In this case, the solder resist 170 may have different heights for each part. Here, the height for each part of the solder resist 170 may be determined by a height of the upper outer layer circuit pattern 140.

The upper outer layer circuit pattern 140 may have a first height H1 and may be disposed on the insulating layer 110. In this case, the insulating layer 110 may refer to an insulating layer disposed on an uppermost side of a plurality of insulating layers. However, hereinafter, for convenience of description, this will be referred to as the insulating layer 110. Meanwhile, the primer layer 150 may be disposed between the insulating layer 110 and the upper outer layer circuit pattern 140. In this case, the upper outer layer circuit pattern 140 may be disposed on the primer layer 150 to have the first height H1. In addition, 'height' described below may correspond to 'thickness'.

The first height H1 of the upper outer layer circuit pattern 140 may be 12 μm±2 μm. For example, the first height H1 of the upper outer layer circuit pattern 140 may be in a range of 10 μm to 14 μm.

The third part of the solder resist 170 may be disposed on the upper outer layer circuit pattern 140 to have a second height H2. In this case, the third part of the solder resist 170 is disposed to cover the upper outer layer circuit pattern 140 in order to stably protect the upper outer layer circuit pattern 140. In this case, the second height H2 may be 7 μm to 17 μm. When the second height H2 is smaller than 7 μm, the upper outer layer circuit pattern 140 buried in the third part of the solder resist 170 may not be stably protected from various factors. In addition, when the second height H2 is greater than 17 μm, an overall thickness of the circuit board may increase. In addition, when the second height H2 is greater than 17 μm, manufacturing costs of the circuit board may increase.

Meanwhile, a second part 173 of the solder resist 170 disposed in the second region R2 includes an opening region R2-2 and may to have the second height H2 from an upper surface of the solder resist 170. That is, the second part 173 of the solder resist 170 may be disposed to cover an edge region while exposing a central region of the upper surface of the upper outer layer circuit pattern 140 disposed in the second region R2. That is, the second part 173 may include the opening region R2-2 exposing a first portion of the upper surface of the upper outer layer circuit pattern 140 and may be disposed to have the second height H2 above a second portion of the upper outer layer circuit pattern 140. In this case, the second height H2 may correspond to the height of the third part of the solder resist 170.

In this case, the upper outer layer circuit pattern 140 included in the second region R2 is the second pad 143. The second pad 143 may be a BGA pad or a core pad as described above. Therefore, the second pad 143 may have a width relatively larger than other pads. As an example, the second pad 143 may have a width W3 of 100 μm to 300 μm. In addition, since the second pad 143 has a relatively large width, the second pad 143 is not significantly affected by the resolution of the exposing. That is, the second pad 143 has a relatively large width, and thus there is no problem in reliability even when only a part of an upper surface of the second pad 143 is exposed instead of the entire surface. In other words, even when only a part of the upper surface of the second pad 143 is exposed, a die function for bonding with another external board is not significantly affected. Therefore, the second part 173 may be disposed to cover a part of the upper surface of the second pad 143 as described above. In detail, the second part 173 has the second height H2, is disposed to protrude above the upper surface of the second pad 143, and has the opening region R2-2 exposing a part of the upper surface of the second pad 143.

Meanwhile, the first part of the solder resist 170 disposed in the first region R1 may have a height smaller than the second height. In this case, the first part may have different heights for each region.

That is, the first region R1 may be divided into a plurality of sub-regions. For example, the first region R1 may include a first sub-region R1-1 and a second sub-region R1-2. In this case, the first sub-region R1-1 may be a region of the first region R1 where the trace 141 is disposed. In addition, the second sub-region R1-2 may be a region of the first region R1 where the first pad 142 is disposed.

Meanwhile, the second region R2 may also be referred to as a third sub-region of the first region R1. That is, when the solder resist 170 is divided into an open region and a non-open region, the open region of the solder resist 170 may be divided into the first sub-region R1-1 in which the trace 141 is disposed, the second sub-region R1-2 in which the first pad 142 is disposed, and a third sub-region R2 in which the second pad 143 is disposed. In addition, when the regions are divided as described above, the non-open region of the solder resist 170 may be referred to as a second region.

Meanwhile, the first part of the solder resist 170 may include a first sub-part 171 and a second sub-part 172.

The first sub-part 171 may be disposed in the first sub-region R1-1 of the first region R1 where the trace 141 is disposed. In addition, the second sub-part 172 may be disposed in a second sub-region R1-2 of the first region R1 where the first pad 142 is disposed.

In this case, the first sub-part 171 and the second sub-part 172 may have different heights. For example, the first sub-part 171 may be disposed higher than the second sub-part 172. In detail, an upper surface of the first sub-part 171 may be positioned higher than an upper surface of the second sub-part 172.

The first sub-part 171 may be disposed in the first sub-region R1-1 to have a third height H3. In this case, the third height H3 may be greater than the first height H1. Accordingly, the first sub-part 171 may protrude at a predetermined height above an upper surface of the trace 141 in the first sub-region R1-1. That is, the trace 141 disposed in the first region R1 may be covered by the first sub-part 171 of the solder resist 170. Accordingly, in the embodiment, the trace 141 disposed in the first region R1 corresponding to the open region may be stably protected.

Meanwhile, the upper surface of the first sub-part 171 is positioned lower than an upper surface of the second part 173. For example, the first sub-part 171 may protrude above the upper surface of the trace 141 to have a height of 3 µm to 5 µm. When a protrusion height of the first sub-part 171 from the upper surface of the trace 141 is smaller than 3 µm, the trace 141 may not be stably protected from external factors, thereby causing a problem in reliability. In addition, when the protrusion height of the first sub-part 171 from the upper surface of the trace 141 is greater than 5 µm, the second sub-part 172 may not be accurately formed at a desired position. In other words, when the protrusion height of the first sub-part 171 from the upper surface of the trace 141 is greater than 5 µm, the resolution of the exposing is lowered, and accordingly, the second sub-part 172 may not be accurately formed at the desired position. In addition, when the second sub-part 172 may not be accurately formed at a desired position, a part of an upper surface of the first pad 142 may be covered by the solder resist 170, thereby causing a problem in reliability.

In this case, the second part 173 protrudes above the second pad 143 to have a height of 7 µm to 17 µm. Accordingly, the upper surface of the first sub-part 171 may be positioned lower than the upper surface of the second part 173.

That is, the first sub-part 171 of the solder resist 170 may be a portion developed primarily in a thinning process of the solder resist 170. In addition, the first sub-part 171 of the solder resist 170 may be a primary exposure and development region for forming the second sub-part 172, which will be described later, in a precise position while stably protecting a surface of the trace 141 included in the first region R1.

The second sub-part 172 of the solder resist 170 may be formed in the second sub-region R1-2 of the first region R1 where the first pad 142 is disposed.

The second sub-part 172 may expose the upper surface of the first pad 142. That is, the second sub-part 172 may have a fourth height H4 smaller than the first height H1 of the first pad 142. Accordingly, the upper surface of the second sub-part 172 may be positioned lower than the upper surface of the first pad 142.

The second sub-part 172 may be a portion developed secondarily in the thinning process of the solder resist 170. That is, the second sub-part 172 may be a part of the primarily developed portion. That is, the second sub-part 172 may have a height lower than that of the first sub-part 171 by secondarily developing the primarily developed portion.

The fourth height H4 may be determined by the first height H1. For example, the fourth height H4 may be 70% to 90% of the first height H1. For example, when the fourth height H4 is smaller than 70% of the first height H1, the first pad 142 may not be stably supported by the second sub-part 172 of the solder resist 170. For example, when the fourth height H4 is smaller than 70% of the first height H1, there may be process difficulties in forming the second sub-part 172 of the solder resist. For example, when the fourth height H4 is greater than 90% of the first height H1, a part of a filler included in the solder resist 170 may remain on the first pad 142. For example, when the fourth height H4 is greater than 90% of the first height H1, 0, a problem in which the surface of the first pad 142 is covered may occur due to a deviation in a process of forming the solder resist 160.

In this case, the first pad 142 may be a mounting pad on which a chip device is mounted and may generally have a width W2 of about 45 µm. For example, the width W2 of the first pad 142 in a transverse-axis direction may be about 45 µm. Accordingly, when the first pad 142 needs to be exposed, exposure and development should be accurately performed only in the region where the first pad 142 is disposed. In this case, a resolution for the exposure and development (e.g., accuracy with respect to a size and position of the exposure and development region) may increase as a thickness of the solder resist 170 in a portion to be developed decreases. Accordingly, in the embodiment, the solder resist 170 is primarily exposed and developed so as to lower a height of the solder resist 170 in the first region R1 to a level of the third height H3 described above. In addition, in the embodiment, the solder resist 170 is secondarily exposed and developed so as to lower the solder resist 170 in the second sub-region R1-2 of the first region R1 to the fourth height H4.

In the embodiment, the first sub-part 171, the second sub-part 172, the second part 173, and the third part of the solder resist 170 are respectively formed by performing the two-step exposure and development process as described above. Accordingly, in the embodiment, the first sub-part 171 of the solder resist 170 is disposed to protrude above the upper surface of the trace 141 in the first sub-region R1-1, and accordingly, the trace 141 may be stably protected. In addition, the second sub-part 172 of the solder resist 170 may expose the entire upper surface of the first pad 142 in the second sub-region R1-2.

In this case, in the secondary exposure and development process, when only the portion on which the first pad 142 is disposed may be accurately exposed and developed, the second sub-part 172 may not substantially exist. That is, in this case, the solder resist 170 may be disposed to have an overall third height H3 while including an opening exposing the upper surface of the pad.

However, it is difficult to accurately expose and develop only the portion on which the first pad 142 is disposed due to a process deviation or various causes, and accordingly, exposure and development positions may be shifted according to the process deviation. In this case, in the secondary exposure and development process, the solder resist disposed on the first pad 142 may not all be developed and some may remain. In addition, this causes a problem in reliability as the upper surface of the first pad 142 is not exposed.

Therefore, in the embodiment, in consideration of a positional shift that may occur due to the process deviation or various causes, a width W4 greater than the width W2 of the first pad 142 is exposed and developed in the secondary exposure and development process.

Accordingly, the second sub-part 172 may be disposed to surround at least a part of side surfaces of the first pad 142. In addition, the secondary developing process may be performed so that the second sub-part 172 has the same height as the first pad 142. However, in this case, a part of the solder resist may remain on the first pad 142, and thus a problem in reliability may occur. Therefore, in the embodiment, the upper surface of the second sub-part 172 is positioned lower than the upper surface of the first pad 142 so as to solve the reliability problem described above.

The solder resist 170 may use a photo solder resist film. The solder resist 170 may have a structure in which a resin and a filler are mixed.

For example, the solder resist 170 may include a filler such as $BaSO_4$, $SiO_2$, and Talc, and a content thereof may be 20 wt % to 35 wt %.

In this case, when the content of the filler included in the solder resist 170 is smaller than 20 wt %, the upper outer layer circuit pattern 140 may not be stably protected by the solder resist 170. In addition, when the content of the filler included in the solder resist 170 is greater than 35 wt %, some of the filler may remain on the upper outer layer circuit pattern 140 during the development of the solder resist 170, and accordingly, a problem in reliability may occur, or a process of removing the filler should be additionally performed.

Meanwhile, in the embodiment, the upper surface of the third part of the solder resist 170 is a portion that is not exposed and developed.

In addition, the first sub-part 171, the second sub-part 172, and the second part 173 of the solder resist 170 are portions that are exposed and developed.

Therefore, the filler may be partially exposed on upper surfaces of the first sub-part 171, the second sub-part 172, and the second part 173. However, in the third part of the solder resist 170, the filler may not be directly exposed.

Therefore, surface roughness of each of the first sub-part 171, the second sub-part 172, and the second part 173 may be different from a surface roughness of the third part of the solder resist 170. For example, the surface roughness of each of the first sub-part 171, the second sub-part 172, and the second part 173 may be greater than the surface roughness of the third part of the solder resist 170.

The circuit board in the embodiment is a circuit board having a structure of multi-layers with eight or more layers and includes an outer layer circuit pattern disposed on an outer insulating layer positioned at an uppermost portion among the multi-layers and protruding above a surface of the outer insulating layer. In this case, the outer layer circuit pattern includes a first outer layer circuit pattern positioned in first and second regions where a solder resist is not disposed and a second outer layer circuit pattern positioned in a third region where the solder resist is disposed. In this case, the second outer layer circuit pattern may be supported and protected by the solder resist, but the first outer layer circuit pattern does not have a support layer capable of supporting the first outer layer circuit pattern, and thus there is a problem that the first outer layer circuit pattern may easily collapse due to various factors.

Accordingly, in the embodiment, the solder resist in the first and second regions is not entirely removed and remains, thereby supporting and protecting the first outer layer circuit pattern by the solder resist. Accordingly, in the embodiment, it is possible to solve problems such as collapsing or rubbing of the first outer layer circuit pattern of the first and second regions by making the outer layer circuit pattern fine, thereby improving product reliability. In particular, in the embodiment, it is possible to solve problems such as collapsing or rubbing of a trace included in the first outer layer circuit pattern in the first region, thereby improving the product reliability.

Meanwhile, the solder resist according to the embodiment includes a first part disposed in the first region, a second part disposed in the second region, and a third part disposed in the third region. In addition, the second part may have an opening and have the same height as the third part. In addition, the first part includes a first sub-part having a height lower than those of the second part and the third part and a sub-part having a height lower than that of the first sub-part. The first sub-part may be formed to cover a surface of the trace of the first outer layer circuit pattern disposed in the first region. In addition, the second sub-part may have a height lower than that of a first pad while exposing a surface of the first pad of the first outer layer circuit pattern disposed in the first region. That is, in the embodiment, the first sub-part, the second sub-part, the second part, and the third part are formed by exposing and developing the solder resist in two steps. Accordingly, in the embodiment, resolution of the exposing may be improved. In addition, in the embodiment, the surface of the trace may be stably protected through the first sub-part in the first region, thereby improving the product reliability.

In addition, in the embodiment, both the surface of the insulating layer or the surface of the primer layer has a structure of being covered by the solder resist, and accordingly, it is possible to solve a problem in reliability due to exposure of the surface of the insulating layer or a part of the primer layer. In detail, the exposure of the surface of the insulating layer or a part of the primer layer refers that a certain space exists between the outer layer circuit pattern and the solder resist. In addition, when the certain space exists, a residual solution such as an adhesive member remains in the space or a void is generated due to the residual solution, thereby causing a problem in reliability. On the other hand, in the embodiment, the space may be filled with the solder resist, thereby solving the reliability problem.

In addition, in the embodiment, the second sub-part of the solder resist is disposed around the first pad, and the first sub-part is disposed around the second sub-part. In addition, the first sub-part may prevent movement of an adhesive member (e.g., a solder ball) to be disposed on the first pad. That is, the first sub-part serves as a dam capable of fixing a position of the adhesive member. Accordingly, in the embodiment, it is possible to solve a problem in reliability such as a short circuit caused by a part of the adhesive member flowing down.

In addition, in the embodiment, in removing the solder resist, an exposure and development method are used instead of sand blasting or a plasma method. In this case, when the solder resist is removed by sandblasting or the plasma method, deformation of the outer layer circuit pattern may occur, and in some cases, the cross-section of the outer layer circuit pattern may have a triangular shape. In addition, when the cross-section of the outer layer circuit pattern has the triangular shape, the adhesive member may not be stably disposed on the outer layer circuit pattern, thereby causing the reliability problem. On the contrary, in the embodiment, the solder resist may be removed without deformation of the outer layer circuit pattern, thereby improving reliability.

In addition, the circuit board in the embodiment may be applied to a 5G communication system, and accordingly, transmission loss of a high frequency can be minimized, thereby further improving the reliability. Specifically, the circuit board in the embodiment can be used at the high frequency and can reduce wave loss.

Meanwhile, in the embodiment, in forming the solder resist 170 as described above, various methods may be used to remove a part of the solder resist 170 from the first region R1 and the second region R2. For example, a part of the solder resist 170 may be removed by a physical method or a chemical method. For example, the solder resist 170 may be removed by a method such as plasma or sand blasting.

However, when the solder resist 170 is removed by the physical method or the chemical method, the upper outer layer circuit pattern 140 is also removed during this process, so that the upper outer layer circuit pattern 140 is deformed. For example, the upper outer layer circuit pattern 140 may have a triangular cross-section because a part of the upper outer layer circuit pattern 140 is removed together during the removal process of the solder resist 170. In addition, when an upper portion of the upper outer layer circuit pattern 140 has a triangular shape, the adhesive member such as the solder ball may not be stably seated on the upper outer layer circuit pattern 140, and thus a problem in reliability may occur. In addition, in order to remove the protective layer by the physical or chemical method, expensive equipment is required, and thus manufacturing costs may increase.

On the other hand, in the embodiment, the solder resist 170 may be removed so as to have a desired height for each region by applying a thinning method through the exposure and development process. In addition, during the exposure and development process, the upper outer layer circuit pattern 140 is not deformed, and the cross-sectional shape of the upper outer layer circuit pattern 140 may be maintained in a quadrangular shape.

Hereinafter, the second sub-part 172 of the solder resist 170 according to the embodiment will be described in detail.

FIG. 5 is an enlarged view of a second sub-part according to an embodiment, FIG. 6A is a view for describing a first shift of the second sub-part according to the embodiment, and FIG. 6B is a view for describing a second shift of the second sub-part according to the embodiment.

Referring to FIGS. 5, 6A, and 6B, the second sub-part 172 may be formed by performing secondary exposure and development so that a part of the first sub-part 171 in the first region R1 that is primarily exposed and developed has a width W4 greater than the width W2 of the first pad 142.

In this case, the second sub-part 172 may have a height lower than that of the first pad 142. That is, the upper surface of the second sub-part 172 may be positioned lower than the upper surface of the first pad 142.

The second sub-part 172 may be disposed in contact with at least a part of a side surface of the first pad 142.

The first pad 142 may include a major axis and a minor axis. In addition, a width W2-1 of the major axis of the first pad 142 may be about 80 μm. In addition, a width W2-2 of the minor axis of the first pad 142 may be about 45 μm.

In addition, the width W4 of a region to be secondarily exposed and developed may have a 4-1 width W4-1 in a longitudinal-axis direction of the first pad 142, and a 4-2 width W4-2 in a transverse-axis direction of the first pad 142. In this case, the 4-1 width W4-1 may be 10 μm to 12 μm larger than the width W2-1 of the major axis of the first pad 142. In addition, the 4-2 width W4-2 may be 10 μm to 12 μm larger than the width W2-2 of the minor axis of the first pad 142.

In this case, the second sub-parts 172 may be respectively disposed on a plurality of side surfaces of the first pad 142. For example, the second sub-part 172 may be disposed to surround a periphery of the first pad 142.

For example, the second sub-part 172 may be formed to have a 5-1 width W5-1 on a first side surface of the first pad 142. In addition, the second sub-part 172 may be formed to have a 5-2 width W5-2 on a second side surface of the first pad 142. In addition, the second sub-part 172 may be formed to have a 5-3 width W5-3 on a third side surface of the first pad 142. In addition, the second sub-part 172 may be formed to have a 5-4 width W5-4 on a fourth side surface of the first pad 142.

In this case, as an example, the 5-1 width W5-1, the 5-2 width W5-2, the 5-3 width W5-3, and the 5-4 width W5-4 may be the same as each other. This is because exposure and development were performed at an accurate position in the secondary exposure and development process. In this case, the 5-1 width W5-1, the 5-2 width W5-2, the 5-3 width W5-3, and the 5-4 width W5-4 may be 10 μm to 12 μm.

Meanwhile, one side surface of the first pad 142 may be directly connected to the trace 141. Accordingly, a part of the second sub-part 172 may be disposed to expose a part of the upper surface of the trace 141.

That is, the trace 141 includes a first portion 141a directly connected to the side surface of the first pad 142 and a second portion other than the first portion 141a. In addition, a surface of the first portion 141a may be exposed by the second sub-part 172. In addition, a surface of the second portion 141b may be covered by the first sub-part 171.

Meanwhile, in the embodiment, the 5-1 width W5-1, the 5-2 width W5-2, the 5-3 width W5-3, the 5-3 width W5-3, and the 5-4 width W5-4 of the second sub-part 172 may be different from each other. This is because exposure and development are not performed at an accurate position corresponding to a center of the first pad 142, and a positional shift occurs due to process deviation in the secondary exposure and development process. In addition, in the embodiment, in preparation for such a situation, the width of the region to be secondarily exposed and developed is larger than the width of the first pad 142.

Therefore, as shown in FIG. 6A, a 5-3 width' W5-3' of the second sub-part 172 disposed on the third side surface of the first pad 142 and a 5-4 width' W5-4' of the second sub-part 172 disposed on the fourth side surface opposite to the third side surface may be different from each other.

In this case, a sum of widths of the 5-3 width' W5-3' and the 5-4 width' W5-4' may be 20 μm to 24 μm.

In addition, as shown in FIG. 6B, a maximum positional shift to one side surface of the first pad 142 may occur in the second sub-part 172. In this case, the second sub-part 172 may be disposed to have a 5-3 width" W5-3" only on the third side surface of the first pad 142. In addition, the second sub-part 172 may not be disposed on the fourth side surface of the first pad 142, but the first sub-part 171 may be disposed thereon. In this case, the 5-3 width" W5-3" may be 20 μm to 24 μm.

FIG. 7 is a view for describing reliability of a solder resist structure according to an embodiment and Comparative example.

As shown in (a) of FIG. 7, in Comparative example, a solder resist may be disposed around a trace 141a and a first pad 142a, but the solder resist is formed to have a height lower than the first pad 142a or the trace 141a.

Accordingly, in Comparative example, when an adhesive member such as a solder ball SB is disposed on the first pad 142a, a structure for fixing a position of the adhesive member does not exist, and accordingly, in a state in which the first pad 142a is disposed, the position may be moved by various factors. As an example, the adhesive member may move to a position where the trace 141a is disposed by various factors (e.g., temperature or position deviation, etc.) in the state in which the adhesive member is disposed on the first pad 142a, and accordingly, a problem in reliability such as a short circuit may occur due to the trace 141a and the first pad 142a being in electrical contact with each other.

On the other hand, as shown in FIG. 7B, in the embodiment, a second sub-part 172 of the solder resist 170 is disposed around the first pad 142, and the second sub-part 172 is disposed around the first pad 142. The first sub-part 171 is disposed around it. In addition, the first sub-part 171 may prevent movement of the adhesive member (e.g., the solder ball SB) to be disposed on the first pad 142. That is, the upper surface of the first sub-part 171 is positioned higher than an upper surface of the first pad 142, and thus serves as a dam capable of fixing the position of the adhesive member. Accordingly, in the embodiment, it is possible to solve a problem in reliability such as a short circuit caused by a part of the adhesive member flowing down.

FIG. 8 is a view for describing a surface roughness for each part of the solder resist according to the embodiment.

In the embodiment, the solder resist 170 may have different surface roughness for each part. For example, the upper surface of the third part of the solder resist 170 or the upper surface of the second part 173 is an undeveloped surface. In contrast, the upper surface of the first part of the solder resist 170, specifically, the upper surface of the first sub-part 171 or the upper surface of the second sub-part 172 is a surface that has been developed step by step. In addition, a filler is present in the solder resist 170. Therefore, the filler may be exposed to a surface on the upper surface of the first sub-part 171 or the upper surface of the second sub-part 172 by the stepwise development. In addition, the upper surface of the first sub-part 171 or the upper surface of the second sub-part 172 may have a surface roughness greater than that of the upper surface of the third part or the second part 173.

For example, the upper surface of the third part or the upper surface of the second part 173 of the solder resist 170 may have a surface roughness different from that of the upper surface of the first sub-part 171 or the upper surface of the second sub-part 172.

That is, the upper surface of the first sub-part 171 or the upper surface of the second sub-part 172 is a surface thinned by a developer after exposure and development processes are performed. In addition, the third part or the second part 173 of the solder resist 170 is a surface cured by exposure.

Therefore, a centerline surface roughness Ra of the upper surface of the first sub-part 171 or the upper surface of the second sub-part 172 may be 1.0 μm or more.

In addition, the centerline surface roughness Ra of the upper surface of the third part or the second part 173 of the solder resist 170 may be in a range of 0.01 μm to 0.1 μm.

FIGS. 9 to 19 are views showing a method of manufacturing the circuit board shown in FIG. 3 in order of a process.

Referring to FIG. 9, in the embodiment, first, a process of manufacturing an inner substrate 100-1 for manufacturing an inner portion of the circuit board 100 may be performed.

The process for manufacturing the inner layer substrate 100-1 will be briefly described.

The inner layer substrate 100-1 may include one insulating layer, or alternatively, a plurality of insulating layers.

It is illustrated in FIG. 9 that the inner-layer substrate 100-1 has an insulating layer structure with seven layers, but the embodiment is not limited thereto. For example, the inner layer substrate 100-1 may include an insulating layer less than seven layers, or alternatively, more than seven layers.

The inner layer substrate 100-1 may include remaining insulating layers excluding an insulating layer disposed on an outermost layer of the circuit board 100. For example, the inner layer substrate 100-1 may include an insulating layer disposed on an uppermost portion of the circuit board 100 and remaining insulating layers excluding an insulating layer disposed on a lowermost portion of the circuit board 100.

Briefly describing the process of manufacturing the inner layer substrate 100-1, first, the first insulating layer 111 is prepared.

Then, when the first insulating layer 111 is prepared, a first via V1 is formed in the first insulating layer 111, and a circuit pattern 121 and a second circuit pattern 122 are formed on upper and lower surfaces of the first insulating layer 111, respectively.

Thereafter, a second insulating layer 112 is formed on the first insulating layer 111, and a third insulating layer 113 is formed under the first insulating layer 111.

Next, a second via V2 is formed in the second insulating layer 112, and a third circuit pattern 123 is formed on an upper surface of the second insulating layer 112. In addition, a third via V3 is formed in the third insulating layer 113, and a fourth circuit pattern 124 is formed under a lower surface of the third insulating layer 113.

Thereafter, a fourth insulating layer 114 is formed on the second insulating layer 112, and a fifth insulating layer 115 is formed under the third insulating layer 113.

Next, a fourth via V4 is formed in the fourth insulating layer 114, and a fifth circuit pattern 125 is formed on an upper surface of the fourth insulating layer 114. In addition, a fifth via V5 is formed in the fifth insulating layer 115, and a sixth circuit pattern 126 is formed under a lower surface of the fifth insulating layer 115.

Thereafter, a sixth insulating layer 116 is formed on the fourth insulating layer 114, and a seventh insulating layer 117 is formed under the fifth insulating layer 115.

Next, a sixth via V6 is formed in the sixth insulating layer 116, and a seventh circuit pattern 127 is formed on an upper surface of the sixth insulating layer 116. In addition, a seventh via V7 is formed in the seventh insulating layer 117, and an eighth circuit pattern 128 is formed under a lower surface of the seventh insulating layer 117.

Since the process of manufacturing the inner layer substrate 100-1 is a known technique in a technical field to which the present invention pertains, a detailed description thereof will be omitted.

Referring to FIG. 10, when the inner layer substrate 100-1 is manufactured, an eighth insulating layer 118 corresponding to a first outermost insulating layer is formed on an upper surface of the inner layer substrate 100-1. In addition, a ninth insulating layer 119 corresponding to a second outermost insulating layer is formed under a lower surface of the inner layer substrate 100-1.

In this case, when the eighth insulating layer 118 and the ninth insulating layer 119 are stacked, a primer layer 150 may be respectively disposed on the upper surface of the eighth insulating layer 118 and the lower surface of the ninth insulating layer 119, and a metal layer 155 may be disposed on the primer layer 150. The metal layer 155 may serve to planarize the eighth insulating layer 118 and the ninth insulating layer 119 to have uniform heights. For example, the metal layer 155 may be disposed in order to improve stacking reliability of the eighth insulating layer 118 and the ninth insulating layer 119.

The primer layer 150 may serve to increase bonding force between a lower outer layer circuit pattern 130 and an upper outer layer circuit pattern 140 that are disposed on and under the eighth insulating layer 118 and the ninth insulating layer 119, respectively. That is, when the lower outer layer circuit pattern 130 and the upper outer layer circuit pattern 140 are disposed without the primer layer 150, the bonding force between the eighth insulating layer 118 and the upper outer layer circuit pattern 140 is low, and thus they may be separated from each other.

Meanwhile, it is illustrated in FIG. 10 that the primer layer 150 is respectively disposed on the upper surface of the eighth insulating layer 118 and the lower surface of the ninth insulating layer 119, but the embodiment is not limited thereto. For example, the primer layer 150 may be selectively disposed on a surface of an insulating layer on which a fine circuit pattern is to be disposed. That is, when only the lower outer layer circuit pattern 130 is a fine circuit pattern, the primer layer 150 may be disposed only on the lower surface of the ninth insulating layer 119. In addition, when only the upper outer layer circuit pattern 140 is a fine circuit pattern, the primer layer 150 may be disposed only on the upper surface of the eighth insulating layer 118. In addition, when the lower outer layer circuit pattern 130 and the upper outer layer circuit pattern 140 are both fine circuit patterns, the primer layer 150 may be disposed on both the upper surface of the eighth insulating layer 118 and the lower surface of the ninth insulating layer 119.

Referring to FIG. 11, when the eighth insulating layer 118 and the ninth insulating layer 119 are disposed, a via hole VH is respectively formed in the eighth insulating layer 118 and the ninth insulating layer 119. In this case, the via hole VH may be respectively formed not only in the eighth insulating layer 118 and the ninth insulating layer 119 but also in the primer layer 150 and the metal layer 155.

Next, referring to FIG. 12, when the via hole VH is formed, an etching process of removing the metal layer 155 disposed on the primer layer 150 may be performed. For example, after the via hole VH is formed, a flash etching process may be performed to remove the metal layer 155, and thus a process for exposing a surface of the primer layer 150 may be performed.

Next, referring to FIG. 13, a via V forming process for filling the via hole VH may be performed, and thus the upper outer layer circuit pattern 140 may be formed on the upper surface of the eighth insulating layer 118, and the lower outer layer circuit pattern 130 may be formed on the lower surface of the ninth insulating layer 119. In this case, in the embodiment, it is illustrated that the lower outer layer circuit pattern 130 is a general circuit pattern rather than a fine circuit pattern, but the embodiment is not limited thereto, and the lower outer layer circuit pattern 130 together with the second outer layer circuit pattern may be a fine circuit pattern. Accordingly, when the lower outer layer circuit pattern 130 is a general circuit pattern, the primer layer 150 between the ninth insulating layer 119 and the lower outer layer circuit pattern 130 may be omitted.

The upper outer layer circuit pattern 140 is disposed on the upper surface of the eighth insulating layer 118. In this case, the upper outer layer circuit pattern 140 disposed on the upper surface of the eighth insulating layer 118 may include a portion disposed in open regions R1 and R2 of the first protective layer 170 and a portion disposed in a disposing region R3 where the first protective layer 170 is disposed. In addition, a trace and a pad that are wiring lines for signal transmission may be disposed in each of the regions R1, R2, and R3.

Specifically, a trace 141 and a first pad 142 may be disposed in a first region R1. The first pad 142 may be a mounting pad on which a device is to be mounted.

In addition, a second pad 143 may be disposed in a second region R2. The second pad 143 may be a BGA pad or a core pad. In particular, the second pad 143 may have a width greater than that of the first pad 142. Accordingly, the second pad 143 is not significantly affected by a development resolution, and accordingly, a solder resist 170 having a shape different from that of the solder resist 170 disposed in the first region R1 may be disposed.

Next, referring to FIG. 14, a solder resist layer is disposed on the primer layer 150 so as to cover the upper outer layer circuit pattern 140. The solder resist layer formed at this time may be disposed in all of the first region R1, the second region R2, and the third region R3 and may be formed so as to have a height greater than that of the upper outer layer circuit pattern 140.

Next, referring to FIG. 15, a primary exposure process may be performed. The primary exposure process may be performed to lower a thickness of the solder resist 170 to a certain level or less.

The primary exposure may be performed with respect to a region excluding the first region R1 and an opening R2-2 in the second region R2. Preferably, the primary exposure may be performed with respect to the third region and a region R2-1 excluding the opening R2-2 in the second region R2.

Here, a portion exposed to light by the primary exposure is cured and is not thinned in a subsequent development process.

Next, referring to FIG. 16, a primary development process may be performed on a portion that is not cured in the primary exposure process. In this case, the solder resist 170 formed in the primary developed portion may have a third height H3.

The primary development process may include a process of thinning that is performed on an unexposed region using an organic alkaline compound containing tetramethylammonium hydroxide (TMAH) or trimethyl-2-hydroxyethylammonium hydroxide (choline).

Next, referring to FIG. 17, a secondary exposure process may be performed. The secondary exposure process may be performed to lower a thickness of a part of the primary exposed solder resist 170 to a certain level or less.

The secondary exposure may be performed on a first sub-region R1-1 in the first region R1. That is, the secondary exposure process may be performed only on the first sub-region R1-1 among portions not exposed in the primary exposure process.

That is, the secondary exposure process may be performed on a region excluding the opening R2-2 in the second region R2 and a region excluding a second sub-region R1-2 in which the first pad 142 is formed.

Next, referring to FIG. 18, a secondary developing process may be performed on a portion that is not exposed in the secondary exposure process. In this case, the secondary developing process may be performed by removing only a part of the solder resist 170 through thickness control without entirely removing the solder resist 170 of the unexposed portion. Preferably, the secondary development process may be performed by thinning the solder resist 170 so as to have a height lower than an upper surface of the first pad 142 and a height higher than a lower surface of the first pad 142, based on a height of the first pad 142.

In the secondary development process may include a process of thinning that is performed on an unexposed region using an organic alkaline compound containing tetramethylammonium hydroxide (TMAH) or trimethyl-2-hydroxyethylammonium hydroxide (choline).

Next, referring to FIG. 19, a process of forming a second protective layer 175 may be performed. In this case, the second protective layer 175 may be formed together when the solder resist 170 corresponding to the first protective layer is formed.

Meanwhile, in the embodiment, a package substrate may be manufactured using the above-described circuit board.

For example, an adhesive portion (not shown) may be disposed on the first pad 142 of the circuit board. In addition, a chip may be disposed on the adhesive portion.

For example, a plurality of first pads 142 may be formed to be spaced apart in a width direction, and a plurality of chips may be mounted on the plurality of first pads.

For example, any one chip of a central processor (e.g., CPU), a graphic processor (e.g., GPU), a digital signal processor, an encryption processor, a microprocessor, and a microcontroller may be mounted on the pad 142.

For example, at least two different chips among the central processor (e.g., CPU), the graphic processor (e.g., GPU), the digital signal processor, the encryption processor, the microprocessor, and the microcontroller may be mounted on the pad.

The circuit board in the embodiment is a circuit board having a structure of multi-layers with eight or more layers and includes an outer layer circuit pattern disposed on an outer insulating layer positioned at an uppermost portion among the multi-layers and protruding above a surface of the outer insulating layer. In this case, the outer layer circuit pattern includes a first outer layer circuit pattern positioned in first and second regions where a solder resist is not disposed and a second outer layer circuit pattern positioned in a third region where the solder resist is disposed. In this case, the second outer layer circuit pattern may be supported and protected by the solder resist, but the first outer layer circuit pattern does not have a support layer capable of supporting the first outer layer circuit pattern, and thus there is a problem that the first outer layer circuit pattern may easily collapse due to various factors.

Accordingly, in the embodiment, the solder resist in the first and second regions is not entirely removed and remains, thereby supporting and protecting the first outer layer circuit pattern by the solder resist. Accordingly, in the embodiment, it is possible to solve problems such as collapsing or rubbing of the first outer layer circuit pattern of the first and second regions by making the outer layer circuit pattern fine, thereby improving product reliability. In particular, in the embodiment, it is possible to solve problems such as collapsing or rubbing of a trace included in the first outer layer circuit pattern in the first region, thereby improving the product reliability.

Meanwhile, the solder resist according to the embodiment includes a first part disposed in the first region, a second part disposed in the second region, and a third part disposed in the third region. In addition, the second part may have an opening and have the same height as the third part. In addition, the first part includes a first sub-part having a height lower than those of the second part and the third part and a sub-part having a height lower than that of the first sub-part. The first sub-part may be formed to cover a surface of the trace of the first outer layer circuit pattern disposed in the first region. In addition, the second sub-part may have a height lower than that of a first pad while exposing a surface of the first pad of the first outer layer circuit pattern disposed in the first region. That is, in the embodiment, the first sub-part, the second sub-part, the second part, and the third part are formed by exposing and developing the solder resist in two steps. Accordingly, in the embodiment, resolution of the exposing may be improved. In addition, in the embodiment, the surface of the trace may be stably protected through the first sub-part in the first region, thereby improving the product reliability.

In addition, in the embodiment, both the surface of the insulating layer or the surface of the primer layer has a structure of being covered by the solder resist, and accordingly, it is possible to solve a problem in reliability due to exposure of the surface of the insulating layer or a part of the primer layer. In detail, the exposure of the surface of the insulating layer or a part of the primer layer refers that a certain space exists between the outer layer circuit pattern and the solder resist. In addition, when the certain space exists, a residual solution such as an adhesive member remains in the space or a void is generated due to the residual solution, thereby causing a problem in reliability. On the other hand, in the embodiment, the space may be filled with the solder resist, thereby solving the reliability problem.

In addition, in the embodiment, the second sub-part of the solder resist is disposed around the first pad, and the first sub-part is disposed around the second sub-part. In addition, the first sub-part may prevent movement of an adhesive member (e.g., a solder ball) to be disposed on the first pad. That is, the first sub-part serves as a dam capable of fixing a position of the adhesive member. Accordingly, in the embodiment, it is possible to solve a problem in reliability such as a short circuit caused by a part of the adhesive member flowing down.

In addition, in the embodiment, in removing the solder resist, an exposure and development method are used instead of sand blasting or a plasma method. In this case, when the solder resist is removed by sandblasting or the plasma method, deformation of the outer layer circuit pattern may occur, and in some cases, the cross-section of the outer layer circuit pattern may have a triangular shape. In addition, when the cross-section of the outer layer circuit pattern has the triangular shape, the adhesive member may not be stably disposed on the outer layer circuit pattern, thereby causing the reliability problem. On the contrary, in the embodiment, the solder resist may be removed without deformation of the outer layer circuit pattern, thereby improving reliability.

In addition, the circuit board in the embodiment may be applied to a 5G communication system, and accordingly, transmission loss of a high frequency can be minimized, thereby further improving the reliability. Specifically, the circuit board in the embodiment can be used at the high frequency and can reduce wave loss.

The characteristics, structures, effects, and the like described in the above-described embodiments are included in at least one embodiment, but are not limited to only one embodiment. Furthermore, the characteristic, structure, and effect illustrated in each embodiment may be combined or modified for other embodiments by a person skilled in the art. Therefore, it should be construed that contents related to such combination and modification are included in the scope of the embodiment.

Embodiments are mostly described above, but the embodiments are merely examples and do not limit the embodiments, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the embodiment defined in the following claims.

The invention claimed is:

1. A circuit board comprising:
   an insulating layer;
   a circuit layer disposed on the insulating layer; and
   a protective layer disposed on the insulating layer and the circuit layer,
   wherein the protective layer includes:
   a first part disposed along a side surface of the circuit layer to surround the side surface of the circuit layer and having a second height smaller than a first height of the circuit layer; and a second part disposed to surround the first part and having a third height greater than the first height of the circuit layer and the second height of the first part, wherein the first part of the protective layer is in direct contact with the side surface of the circuit layer, and wherein the first part of the protective layer includes a first width and a second width in a horizontal direction that are different from each other along the side surface of the circuit layer between the side surface of the circuit layer and the second part of the protective layer.

2. The circuit board of claim 1, wherein a surface roughness of an upper surface of the first part is same as a surface roughness of an upper surface of the second part.

3. The circuit board of claim 2, wherein the insulating layer includes a plurality of layers, and wherein the circuit layer is disposed on an uppermost insulating layer among the plurality of layers.

4. The circuit board of claim 1, wherein the circuit layer includes a first pad, and wherein the first part of the protective layer is disposed to surround a side surface of the first pad.

5. The circuit board of claim 4, wherein the circuit layer includes a circuit part disposed adjacent to the first pad, and wherein the second part of the protective layer covers at least a portion of an upper surface of the circuit part.

6. The circuit board of claim 4, wherein the circuit layer includes a second pad, wherein the protective layer includes a third part disposed on the second pad and having a fourth height greater than the third height, and wherein the third part of the protective layer covers at least a part of an upper surface of the second pad.

7. The circuit board of claim 6, wherein the third part of the protective layer includes an opening vertically overlapping the upper surface of the second pad.

8. The circuit board of claim 6, wherein a width in the horizontal direction of the first pad is smaller than a width in the horizontal direction of the second pad.

9. The circuit board of claim 6, wherein a vertical distance from the upper surface of the third part of the protective layer to the upper surface of the circuit layer satisfies a range of 7 µm to 17 µm.

10. The circuit board of claim 6, wherein a centerline surface roughness Ra of at least one of upper surfaces of the first part and the second part of the protective layer is greater than a centerline surface roughness Ra of an upper surface of the third part.

11. The circuit board of claim 10, wherein the centerline surface roughness Ra of the upper surface of the third part of the protective layer satisfies a range of 0.01 µm to 0.1 µm.

12. The circuit board of claim 11, wherein the centerline surface roughness Ra of at least one of upper surfaces of the first part and the second part of the protective layer is 1.0 µm or more.

13. The circuit board of claim 4, wherein the first part of the protective layer includes a first sub-part disposed on one side of the first pad and a second sub-part disposed on the other side of the first pad different from the one side, and wherein the first sub-part has the first width, and the second sub-part has the second width.

14. The circuit board of claim 13, wherein a sum of the first width and the second width is in a range of 20 µm to 24 µm.

15. The circuit board of claim 13, wherein the side surface of the first pad includes a first portion in direct contact with the first part of the protective layer, and a second portion disposed on the first portion and overlapping the second part of the protective layer along the horizontal direction without contacting the first part of the protective layer.

16. The circuit board of claim 13, wherein the circuit part includes a first circuit portion most adjacent to the one side of the first pad, and wherein a spacing between the first circuit portion and the first pad is greater than the first width of the first sub-part of the protective layer.

17. The circuit board of claim 16, wherein the circuit part includes a second circuit portion most adjacent to the other side of the first pad, and wherein a spacing between the second circuit portion and the first pad is greater than the second width of the first sub-part of the protective layer.

18. The circuit board of claim 17, wherein the spacing between the first pad and the first circuit portion is different from the spacing between the first pad and the second circuit portion.

19. The circuit board of claim 17, wherein at least a portion of the second part of the protective layer is disposed between the first pad and the first circuit portion and between the first pad and the second circuit portion.

20. The circuit board of claim 1, wherein the second height of the first part of the protective layer satisfies a range of 70% to 90% of the first height of the circuit layer.

* * * * *